US011995575B2

(12) United States Patent
Harpur

(10) Patent No.: US 11,995,575 B2
(45) Date of Patent: May 28, 2024

(54) REAL-TIME CALCULATION OF EXPECTED VALUES TO PROVIDE MACHINE-GENERATED OUTPUTS PROPORTIONAL TO INPUTS

(71) Applicant: Games Global Operations Limited, Douglas (IM)

(72) Inventor: Rory Angus Harpur, Durban North (ZA)

(73) Assignee: Games Global Operations Limited, Douglas (IM)

( * ) Notice: Subject to any disclaimer, the term of this patent is extended or adjusted under 35 U.S.C. 154(b) by 969 days.

(21) Appl. No.: 16/940,782

(22) Filed: Jul. 28, 2020

(65) Prior Publication Data

US 2021/0034997 A1    Feb. 4, 2021

(51) Int. Cl.
    *G06N 20/00*            (2019.01)
    *G06F 3/0346*         (2013.01)
    (Continued)

(52) U.S. Cl.
    CPC ............. *G06N 7/01* (2023.01); *G06F 7/5443* (2013.01); *G06F 17/16* (2013.01); *G07F 17/323* (2013.01);
    (Continued)

(58) Field of Classification Search
    CPC ......... G06N 7/01; G06F 7/5443; G06F 17/16; G06F 3/04847; G06F 30/20; G06F 17/18;
    (Continued)

(56) References Cited

U.S. PATENT DOCUMENTS 5,704,835 A    1/1998    Dietz, II
6,142,872 A    11/2000   Walker et al.
(Continued)

FOREIGN PATENT DOCUMENTS

AU    2003246319    10/2003
AU    2011253848      1/2014
(Continued)

OTHER PUBLICATIONS

Australian Government, IP Australia, Notice of Acceptance dated Sep. 25, 2013, issued in connection with Australian Patent Application No. 2011253848, 2 pages.
(Continued)

*Primary Examiner* — Brandon S Cole
(74) *Attorney, Agent, or Firm* — McDonnell Boehnen Hulbert & Berghoff LLP

(57) ABSTRACT

A computer-implemented method may involve obtaining, for an iteration of a computation that includes a first and a second calculation, a first input signal and a second input signal. In response to obtaining the first and second input signals and based thereon, parameters of the computation may be modified within a predetermined period of time that simulates real-time operation of an apparatus. Modifying the parameters may involve generating a first output signal that is statistically proportional to the combination of the first and second input signals, generating a second output signal that represents an expected value percentage of the first calculation, and adjusting a likelihood of a particular result being generated by the second calculation based on the first output signal and the expected value percentage of the first calculation based on the second output signal. The iteration of the computation may be executed using the modified parameters.

20 Claims, 9 Drawing Sheets

(51) Int. Cl.
- *G06F 3/147* (2006.01)
- *G06F 7/544* (2006.01)
- *G06F 17/16* (2006.01)
- *G06N 7/01* (2023.01)
- *G06Q 10/06* (2023.01)
- *G06Q 10/08* (2023.01)
- *G07F 17/32* (2006.01)
- *G06F 3/04847* (2022.01)
- *G07F 17/34* (2006.01)

(52) U.S. Cl.
CPC ...... *G06F 3/04847* (2013.01); *G07F 17/3213* (2013.01); *G07F 17/3258* (2013.01); *G07F 17/34* (2013.01)

(58) Field of Classification Search
CPC ............... G07F 17/323; G07F 17/3213; G07F 17/3258; G07F 17/34; G07F 17/32; G07F 17/3244
See application file for complete search history.

(56) References Cited

U.S. PATENT DOCUMENTS

| | | | |
|---|---|---|---|
| 6,146,271 A | 11/2000 | Kadlic | |
| 6,186,894 B1 | 2/2001 | Mayeroff | |
| 6,190,255 B1 | 2/2001 | Thomas et al. | |
| 6,203,429 B1 | 3/2001 | Demar et al. | |
| 6,224,483 B1 | 5/2001 | Mayeroff | |
| 6,231,442 B1 | 5/2001 | Mayeroff | |
| 6,234,897 B1 | 5/2001 | Frohm et al. | |
| 6,251,013 B1 | 6/2001 | Bennett | |
| 6,315,560 B1 | 11/2001 | Krouglicof et al. | |
| 6,322,309 B1 | 11/2001 | Thomas et al. | |
| 6,379,248 B1 | 4/2002 | Jorasch et al. | |
| 6,439,993 B1 | 8/2002 | O'Halloran | |
| 6,482,089 B2 | 11/2002 | Demar et al. | |
| 6,506,117 B2 | 1/2003 | Demar et al. | |
| 6,508,707 B2 | 1/2003 | Demar et al. | |
| 6,520,855 B2 | 2/2003 | Demar et al. | |
| 6,561,904 B2 | 5/2003 | Locke et al. | |
| 6,609,971 B2 | 8/2003 | Vancura | |
| 6,645,074 B2 | 11/2003 | Thomas et al. | |
| 6,712,697 B2 | 3/2004 | Acres | |
| 6,743,102 B1 | 6/2004 | Fiechter et al. | |
| 6,852,028 B2 | 2/2005 | Vancura | |
| 6,855,054 B2 | 2/2005 | White et al. | |
| 6,869,360 B2 | 3/2005 | Marks et al. | |
| 6,905,412 B2 | 6/2005 | Thomas et al. | |
| 6,939,228 B2 | 9/2005 | Shimizu | |
| 7,063,617 B2 | 6/2006 | Brosnan et al. | |
| 7,090,580 B2 | 8/2006 | Rodgers et al. | |
| 7,172,505 B2 | 2/2007 | Vancura | |
| 7,195,560 B2 | 3/2007 | Demar et al. | |
| 7,237,775 B2 | 7/2007 | Thomas et al. | |
| 7,258,611 B2 | 8/2007 | Bigelow et al. | |
| 7,291,068 B2 | 11/2007 | Bryant et al. | |
| 7,316,609 B2 | 1/2008 | Dunn et al. | |
| 7,331,862 B2 | 2/2008 | Rodgers et al. | |
| 7,331,866 B2 | 2/2008 | Rodgers et al. | |
| 7,331,867 B2 | 2/2008 | Baelocher et al. | |
| 7,341,518 B2 | 3/2008 | Muskin | |
| 7,381,134 B2 | 6/2008 | Cuddy et al. | |
| 7,390,260 B2 | 6/2008 | Englman | |
| 7,393,278 B2 | 7/2008 | Gerson et al. | |
| 7,419,429 B2 | 9/2008 | Taylor | |
| 7,452,271 B2 | 11/2008 | Demar et al. | |
| 7,520,809 B2 | 4/2009 | Thomas et al. | |
| 7,553,231 B2 | 6/2009 | Rodgers et al. | |
| 7,584,505 B2 | 9/2009 | Mondri et al. | |
| 7,618,319 B2 | 11/2009 | Casey et al. | |
| 7,736,222 B2 | 6/2010 | Casey et al. | |
| 7,801,040 B1 | 9/2010 | Singh et al. | |
| 7,819,737 B2 | 10/2010 | Englman et al. | |
| 7,850,521 B2 | 12/2010 | Rodgers et al. | |
| 7,857,695 B2 | 12/2010 | Rodgers et al. | |
| 7,901,283 B2 | 3/2011 | Thomas et al. | |
| 7,922,579 B2 | 4/2011 | Walker et al. | |
| 7,950,994 B2 | 5/2011 | Berman et al. | |
| 8,029,358 B2 | 10/2011 | Bigelow et al. | |
| 8,030,078 B2 | 10/2011 | Robichaud | |
| RE43,297 E | 4/2012 | Taylor | |
| 8,157,634 B2 | 4/2012 | Englman et al. | |
| 8,177,630 B2 | 5/2012 | Bryant et al. | |
| 8,235,790 B2 | 8/2012 | Yoshizawa | |
| 8,360,840 B2 | 1/2013 | Bennett et al. | |
| 8,382,576 B2 | 2/2013 | Nakamura | |
| 8,430,743 B2 | 4/2013 | Moshal | |
| 8,444,467 B2 | 5/2013 | Englman et al. | |
| 8,449,382 B2 | 5/2013 | Bryant et al. | |
| 8,449,383 B2 | 5/2013 | Bryant et al. | |
| 8,460,094 B2 | 6/2013 | Bigelow et al. | |
| 8,480,480 B2 | 7/2013 | Thomas et al. | |
| 8,529,332 B2 | 9/2013 | Bennett et al. | |
| 8,535,143 B2 | 9/2013 | Hornik et al. | |
| 8,540,565 B2 | 9/2013 | Burghard et al. | |
| 8,585,484 B2 | 11/2013 | Mayor | |
| 8,591,312 B2 | 11/2013 | Roukis et al. | |
| 8,591,316 B2 | 11/2013 | Bryant et al. | |
| 8,602,867 B2 | 12/2013 | Owen et al. | |
| 8,616,950 B2 | 12/2013 | Robichaud | |
| 8,632,393 B2 | 1/2014 | Bryant et al. | |
| 8,636,584 B2 | 1/2014 | Bryant et al. | |
| 8,641,517 B2 | 2/2014 | Bryant et al. | |
| 8,647,194 B2 | 2/2014 | Bigelow et al. | |
| 8,651,940 B2 | 2/2014 | Loat et al. | |
| 8,702,489 B2 | 4/2014 | Cuddy et al. | |
| 8,721,423 B2 | 5/2014 | Saito | |
| 8,734,222 B2 | 5/2014 | Owen et al. | |
| 8,734,237 B2 | 5/2014 | Moshal | |
| 8,747,207 B2 | 6/2014 | Thomas et al. | |
| 8,834,249 B2 | 9/2014 | Bryant et al. | |
| 8,864,568 B2 | 10/2014 | Mizue | |
| 8,864,570 B2 | 10/2014 | Jackson | |
| 8,876,589 B2 | 11/2014 | Strom | |
| 8,974,288 B2 | 3/2015 | Welty et al. | |
| 9,092,938 B2 | 7/2015 | Robichaud | |
| 9,098,976 B2 | 8/2015 | Zimmerman | |
| 9,129,480 B2 | 9/2015 | Nakamura | |
| 9,135,781 B2 | 9/2015 | Nakamura | |
| 9,135,782 B2 | 9/2015 | Nakamura | |
| 9,165,436 B2 | 10/2015 | Welty et al. | |
| 9,208,657 B2 | 12/2015 | Fujisawa et al. | |
| 9,214,071 B2 | 12/2015 | Hornik et al. | |
| 9,224,270 B2 | 12/2015 | Lee et al. | |
| 9,230,411 B2 | 1/2016 | Englman et al. | |
| 9,336,658 B2 | 5/2016 | Suda | |
| 9,336,659 B2 | 5/2016 | Beria | |
| 9,361,756 B2 | 6/2016 | Bryant et al. | |
| 9,412,239 B2 | 8/2016 | Gugler | |
| 9,424,720 B2 | 8/2016 | Suda | |
| 9,564,001 B2 | 2/2017 | Owen et al. | |
| 9,659,456 B2 | 5/2017 | Van Linden | |
| 9,685,035 B2 | 6/2017 | Schattauer et al. | |
| 9,697,694 B2 | 7/2017 | Beria | |
| 9,792,776 B2 | 10/2017 | Bigelow et al. | |
| 9,830,780 B2 | 11/2017 | Cuddy et al. | |
| 9,852,588 B2 | 12/2017 | Opalinski et al. | |
| 9,911,280 B2 | 3/2018 | Beria | |
| 9,934,646 B2 | 4/2018 | Igesund | |
| 9,940,784 B2 | 4/2018 | Schattauer et al. | |
| 9,959,703 B2 | 5/2018 | Igesund | |
| 9,997,012 B2 | 6/2018 | Wortmann et al. | |
| 10,043,348 B2 | 8/2018 | Meyer | |
| 10,068,435 B2 | 9/2018 | Gugler | |
| 10,078,942 B2 | 9/2018 | Suda | |
| 10,147,264 B1 | 12/2018 | Halvorson | |
| 10,169,956 B2 | 1/2019 | Beria | |
| 2001/0009865 A1 | 7/2001 | Demar et al. | |
| 2001/0031659 A1 | 10/2001 | Perrie et al. | |
| 2002/0025847 A1 | 2/2002 | Thomas et al. | |
| 2002/0039920 A1 | 4/2002 | Bryant | |
| 2002/0043759 A1 | 4/2002 | Vancura | |
| 2002/0045474 A1 | 4/2002 | Singer et al. | |

(56) References Cited

U.S. PATENT DOCUMENTS

| | | |
|---|---|---|
| 2002/0068623 A1 | 6/2002 | Gauselmann |
| 2002/0132659 A1 | 9/2002 | Demar et al. |
| 2002/0137560 A1 | 9/2002 | Demar et al. |
| 2002/0137561 A1 | 9/2002 | Demar et al. |
| 2002/0142823 A1 | 10/2002 | Demar et al. |
| 2002/0151359 A1 | 10/2002 | Rowe |
| 2003/0060259 A1 | 3/2003 | Mierau et al. |
| 2003/0064810 A1 | 4/2003 | Okada |
| 2003/0073483 A1 | 4/2003 | Glavich et al. |
| 2003/0126103 A1* | 7/2003 | Chen ................ G06Q 10/08 706/50 |
| 2003/0155715 A1 | 8/2003 | Walker et al. |
| 2003/0162585 A1 | 8/2003 | Bigelow et al. |
| 2003/0162588 A1 | 8/2003 | Brosnan et al. |
| 2003/0181238 A1 | 9/2003 | Demar et al. |
| 2003/0190943 A1 | 10/2003 | Walker et al. |
| 2003/0199307 A1 | 10/2003 | Demar et al. |
| 2003/0199309 A1 | 10/2003 | Demar et al. |
| 2004/0032086 A1 | 2/2004 | Barragan |
| 2004/0048646 A1 | 3/2004 | Visocnik |
| 2004/0072607 A1 | 4/2004 | Thomas et al. |
| 2004/0097280 A1 | 5/2004 | Gauselmann |
| 2004/0162134 A1 | 8/2004 | Walker et al. |
| 2004/0185930 A1 | 9/2004 | Thomas et al. |
| 2004/0219968 A1 | 11/2004 | Fiden et al. |
| 2004/0242312 A1 | 12/2004 | Gomez et al. |
| 2004/0254011 A1 | 12/2004 | Muskin |
| 2004/0259640 A1 | 12/2004 | Gentles et al. |
| 2005/0010715 A1 | 1/2005 | Davies et al. |
| 2005/0043082 A1 | 2/2005 | Peterson et al. |
| 2005/0054420 A1 | 3/2005 | Cregan et al. |
| 2005/0130731 A1 | 6/2005 | Englman et al. |
| 2005/0130737 A1 | 6/2005 | Englman et al. |
| 2005/0153770 A1 | 7/2005 | Vancura |
| 2005/0153778 A1 | 7/2005 | Nelson et al. |
| 2005/0170883 A1 | 8/2005 | Muskin |
| 2005/0181867 A1 | 8/2005 | Thomas et al. |
| 2005/0239545 A1 | 10/2005 | Rowe |
| 2006/0005239 A1 | 1/2006 | Mondri et al. |
| 2006/0030396 A1 | 2/2006 | Marks et al. |
| 2006/0084494 A1 | 4/2006 | Belger et al. |
| 2006/0264254 A1 | 11/2006 | Aoki |
| 2006/0281525 A1 | 12/2006 | Borissov |
| 2007/0026933 A1 | 2/2007 | Tanimura |
| 2007/0054732 A1 | 3/2007 | Baerlocher |
| 2007/0060254 A1 | 3/2007 | Muir |
| 2007/0060303 A1 | 3/2007 | Govender et al. |
| 2007/0060314 A1 | 3/2007 | Baerlocher et al. |
| 2007/0060317 A1 | 3/2007 | Martin |
| 2007/0123340 A1 | 5/2007 | Vancura |
| 2007/0167226 A1 | 7/2007 | Kelly et al. |
| 2007/0265062 A1 | 11/2007 | Thomas et al. |
| 2007/0287529 A1 | 12/2007 | Kojima |
| 2008/0039171 A1 | 2/2008 | Slomiany et al. |
| 2008/0070673 A1 | 3/2008 | Bennett et al. |
| 2008/0076574 A1 | 3/2008 | Okada |
| 2008/0113742 A1 | 5/2008 | Amos et al. |
| 2008/0125211 A1 | 5/2008 | Plowman |
| 2008/0108411 A1 | 8/2008 | Jensen et al. |
| 2008/0197573 A1 | 8/2008 | Palmer |
| 2008/0254875 A1 | 10/2008 | Fujimoto et al. |
| 2008/0287178 A1 | 11/2008 | Berman et al. |
| 2009/0042652 A1 | 2/2009 | Baerlocher et al. |
| 2009/0054129 A1 | 2/2009 | Yoshimura et al. |
| 2009/0069071 A1 | 3/2009 | Aoki et al. |
| 2009/0098930 A1 | 4/2009 | Kato |
| 2009/0104979 A1 | 4/2009 | Ruymann |
| 2009/0117979 A1 | 5/2009 | Decasa, Jr. et al. |
| 2009/0117988 A1 | 5/2009 | Mathis |
| 2009/0131145 A1 | 5/2009 | Aoki et al. |
| 2009/0156303 A1 | 6/2009 | Kiely et al. |
| 2009/0227340 A1 | 9/2009 | Yoshizawa |
| 2009/0227356 A1 | 9/2009 | Moroney |
| 2009/0305769 A1 | 12/2009 | Plowman |
| 2009/0305770 A1 | 12/2009 | Bennett et al. |
| 2009/0325667 A1 | 12/2009 | Weber |
| 2009/0325674 A1 | 12/2009 | Hosokawa |
| 2010/0004048 A1 | 1/2010 | Brito |
| 2010/0004050 A1 | 1/2010 | Caputo et al. |
| 2010/0022297 A1 | 1/2010 | Saunders |
| 2010/0029381 A1 | 2/2010 | Vancura |
| 2010/0056249 A1 | 3/2010 | Yamauchi |
| 2010/0120525 A1 | 5/2010 | Baerlocher et al. |
| 2010/0124988 A1 | 5/2010 | Amos et al. |
| 2010/0197377 A1 | 8/2010 | Aoki et al. |
| 2010/0323780 A1 | 12/2010 | Acres |
| 2011/0003630 A1 | 1/2011 | Rasmussen et al. |
| 2011/0028202 A1 | 2/2011 | Naicker et al. |
| 2011/0065492 A1 | 3/2011 | Acres |
| 2011/0098101 A1 | 4/2011 | Gomez et al. |
| 2011/0117987 A1 | 5/2011 | Aoki et al. |
| 2011/0118001 A1 | 5/2011 | Vann |
| 2011/0124394 A1 | 5/2011 | Thomas et al. |
| 2012/0015713 A1 | 1/2012 | Cannon |
| 2012/0064961 A1 | 3/2012 | Vancura |
| 2012/0122546 A1 | 5/2012 | Lange |
| 2012/0122547 A1 | 5/2012 | Aoki et al. |
| 2012/0244928 A1 | 9/2012 | Visser |
| 2012/0258787 A1 | 10/2012 | Bennett |
| 2012/0276980 A1 | 11/2012 | Moroney |
| 2012/0295688 A1 | 11/2012 | Watkins et al. |
| 2013/0023329 A1 | 1/2013 | Saunders |
| 2013/0065662 A1 | 3/2013 | Watkins et al. |
| 2013/0143635 A1 | 6/2013 | Arora et al. |
| 2013/0157733 A1 | 6/2013 | Thorne et al. |
| 2013/0184047 A1 | 7/2013 | Haykin et al. |
| 2013/0244762 A1 | 9/2013 | Walker et al. |
| 2013/0281191 A1 | 10/2013 | Thomas et al. |
| 2013/0288793 A1 | 10/2013 | Fujisawa et al. |
| 2013/0344939 A1 | 12/2013 | Aoki et al. |
| 2014/0051494 A1 | 2/2014 | Marks et al. |
| 2014/0066169 A1 | 3/2014 | Watkins et al. |
| 2014/0135096 A1 | 5/2014 | Aida et al. |
| 2014/0179400 A1 | 6/2014 | Lee |
| 2014/0228091 A1 | 8/2014 | Berman et al. |
| 2014/0274292 A1 | 9/2014 | Suda |
| 2014/0287814 A1 | 9/2014 | Berman et al. |
| 2014/0295939 A1 | 10/2014 | Thomas et al. |
| 2014/0323198 A1 | 10/2014 | Tuck |
| 2014/0339767 A1 | 11/2014 | Hirato |
| 2014/0342807 A1 | 11/2014 | Vancura |
| 2015/0018069 A1 | 1/2015 | Montenegro et al. |
| 2015/0057068 A1 | 2/2015 | Burghard |
| 2015/0213677 A1 | 7/2015 | Haykin et al. |
| 2015/0248810 A1 | 9/2015 | Wortmann et al. |
| 2015/0248811 A1 | 9/2015 | Wortmann et al. |
| 2015/0287276 A1 | 10/2015 | Humphrey et al. |
| 2015/0302704 A1 | 10/2015 | Montenegro et al. |
| 2015/0363999 A1 | 12/2015 | Little |
| 2015/0379430 A1* | 12/2015 | Dirac ................ G06N 20/00 706/12 |
| 2016/0104345 A1 | 4/2016 | MacGregor et al. |
| 2016/0140795 A1 | 5/2016 | Fong et al. |
| 2016/0180637 A1 | 6/2016 | Honeycutt et al. |
| 2016/0328910 A1 | 11/2016 | Shaik |
| 2016/0351005 A1 | 12/2016 | Igesund |
| 2016/0351006 A1 | 12/2016 | Igesund |
| 2017/0069160 A1 | 3/2017 | Bennett |
| 2017/0092041 A1 | 3/2017 | Kudo |
| 2017/0092042 A1 | 3/2017 | Nakamura |
| 2017/0162003 A9 | 6/2017 | Burghard |
| 2017/0213416 A1 | 7/2017 | Wortmann et al. |
| 2017/0316648 A1 | 11/2017 | Wortmann |
| 2017/0316649 A1 | 11/2017 | Wortmann |
| 2017/0316651 A1 | 11/2017 | Wortmann et al. |
| 2018/0122183 A1 | 5/2018 | Wortmann |
| 2018/0122184 A1 | 5/2018 | Wortmann |
| 2018/0122189 A1 | 5/2018 | Wortmann |
| 2018/0225926 A1 | 8/2018 | Wortmann |
| 2018/0286174 A1 | 10/2018 | Merkel et al. |
| 2018/0286175 A1 | 10/2018 | Kuhlmann et al. |
| 2018/0374296 A1 | 12/2018 | Bennett |

(56) References Cited

U.S. PATENT DOCUMENTS

2019/0019370 A1  1/2019  Ono
2019/0372857 A1* 12/2019  Gandhi ................ H04L 41/147

FOREIGN PATENT DOCUMENTS

| AU | 2013251288 | 5/2014 |
|---|---|---|
| AU | 2018202560 | 5/2018 |
| CA | 2827968 | 3/2014 |
| CA | 2868773 | 4/2015 |
| EP | 1351180 | 10/2003 |
| EP | 2615591 | 3/2013 |
| EP | 2713347 | 4/2014 |
| EP | 2866211 | 4/2015 |
| EP | 2894612 | 7/2015 |
| EP | 2916299 | 9/2015 |
| GB | 2139390 | 11/1984 |
| GB | 2393018 | 3/2004 |
| WO | 2002/41963 | 5/2002 |
| WO | 2006/027677 | 3/2006 |
| WO | 2008/063394 | 5/2008 |
| ZA | 201400816 | 10/2014 |

OTHER PUBLICATIONS

Australian Government, IP Australia, Examination Report No. 4 dated Mar. 9, 2018, issued in connection with Australian Patent Application No. 2016202966, 3 pages.
Australian Government, IP Australia, Examination Report No. 2 dated Mar. 6, 2018, issued in connection with Australian Patent Application No. 2017200271, 3 pages.
Australian Government, IP Australia, Examination Report No. 3 dated Jun. 5, 2018, issued in connection with Australian Patent Application No. 2017200271, 3 pages.
Australian Government, IP Australia, Examination Report No. 2 dated May 11, 2018, issued in connection with Australian Patent Application No. 2017202474, 4 pages.
Australian Government, IP Australia, Examination Report No. 2 dated May 14, 2018, issued in connection with Australian Patent Application No. 2017202574, 4 pages.
Australian Government, IP Australia, Examination Report No. 2 dated May 14, 2018, issued in connection with Australian Patent Application No. 2017202577, 3 pages.
Australian Government, IP Australia, Examination Report No. 2 dated May 14, 2018, issued in connection with Australian Patent Application No. 2017202579, 4 pages.
Australian Government, IP Australia, Examination Report No. 1 dated Mar. 20, 2018, issued in connection with Australian Patent Application No. 2017235913, 2 pages.
Australian Government, IP Australia, Examination Report No. 1 dated Mar. 6, 2018, issued in connection with Australian Patent Application No. 2017235921, 2 pages.
Australian Government, IP Australia, Examination Report No. 1 dated Mar. 6, 2018, issued in connection with Australian Patent Application No. 2017235939, 2 pages.
Australian Government, IP Australia, Examination Report No. 1 dated Mar. 6, 2018, issued in connection with Australian Patent Application No. 2017235945, 2 pages.
Australian Government, IP Australia, Examination Report No. 3 dated Nov. 21, 2017, issued in connection with Australian Patent Application No. 2016202966, 4 pages.
Australian Government, IP Australia, Examination Report No. 1 dated Oct. 14, 2017, issued in connection with Australian Patent Application No. 2017200271, 4 pages.
Australian Government, IP Australia, Examination Report No. 2 dated Jun. 26, 2017, issued in connection with Australian Patent Application No. 2016202965, 2 pages.
Australian Government, IP Australia, Examination Report No. 3 dated Oct. 12, 2017, issued in connection with Australian Patent Application No. 2016202965, 3 pages.
Australian Government, IP Australia, Examination Report No. 1 dated Jan. 30, 2018, issued in connection with Australian Patent Application No. 2017202577, 2 pages.
Australian Government, IP Australia, Examination Report No. 1 dated Jan. 30, 2018, issued in connection with Australian Patent Application No. 2017202579, 2 pages.
Australian Government, IP Australia, Examination Report No. 1 dated Jan. 30, 2018, issued in connection with Australian Patent Application No. 2017202474, 2 pages.
Australian Government, IP Australia, Examination Report No. 1 dated Jan. 30, 2018, issued in connection with Australian Patent Application No. 2017202574, 2 pages.
Australian Government, IP Australia, Examination Report No. 4 dated Feb. 19, 2018, issued in connection with Australian Patent Application No. 2016202965, 3 pages.
Canadian Intellectual Property Office, Examiner's Report dated Jan. 16, 2018, issued in connection with Canadian Patent Application No. 2,929,218, 8 pages.
Canadian Intellectual Property Office, Examiner's Report dated Feb. 6, 2014, issued in connection with Canadian Patent Application No. 2,760,112, 3 pages.
Canadian Intellectual Property Office, Examiner's Report dated Mar. 18, 2015, issued in connection with Canadian Patent Application No. 2,760,112, 6 pages.
Canadian Intellectual Property Office, Final Office Action dated Dec. 2, 2016, issued in connection with Canadian Patent Application No. 2,760,112, 5 pages.
Canadian Intellectual Property Office, Examiner's Report dated May 11, 2018, issued in connection with Canadian Patent Application No. 2,964,233, 5 pages.
Canadian Intellectual Property Office, Examiner's Report dated Mar. 29, 2018, issued in connection with Canadian Patent Application No. 2,964,558, 6 pages.
Canadian Intellectual Property Office, Examiner's Report dated May 11, 2018, issued in connection with Canadian Patent Application No. 2,964,587, 5 pages.
Canadian Intellectual Property Office, Examiner's Report dated Apr. 24, 2018, issued in connection with Canadian Patent Application No. 2,964,739, 5 pages.
Canadian Intellectual Property Office, Examiner's Report dated Dec. 19, 2017, issued in connection with Canadian Patent Application No. 2,954,790, 3 pages.
Canadian Intellectual Property Office, Examiner's Report dated Dec. 19, 2017, issued in connection with Canadian Patent Application No. 2,929,222, 6 pages.
Canadian Intellectual Property Office, Examiner's Report dated dated Apr. 9, 2019, issued in connection with Canadian Application No. 2,964,587 6 pages.
European Patent Office, Office Action dated Sep. 10, 2013, issued in connection with EP Application No. 11194636.4, 5 pages.
European Patent Office, Office Action dated Aug. 23, 2017, issued in connection with EP Application No. 16171832.5, 7 pages.
Non-Final Office Action dated May 22, 2018, issued in connection with U.S. Appl. No. 15/487,022, filed Apr. 13, 2017, 12 pages.
Non-Final Office Action dated Oct. 18, 2017, issued in connection with U.S. Appl. No. 15/140,945, filed Apr. 28, 2016, 12 pages.
Non-Final Office Action dated Feb. 20, 2018, issued in connection with U.S. Appl. No. 15/485,984, filed Apr. 12, 2017, 11 pages.
Non-Final Office Action dated Jan. 29, 2018, issued in connection with U.S. Appl. No. 15/487,869, filed Apr. 14, 2017, 12 pages.
Notice of Allowance dated Mar. 8, 2018, issued in connection with U.S. Appl. No. 15/140,945, filed Apr. 28, 2016, 5 pages.
Notice of Allowance dated Apr. 11, 2018, issued in connection with U.S. Appl. No. 15/485,984, filed Apr. 12, 2017, 7 pages.
Notice of Allowance dated Dec. 20, 2017, issued in connection with U.S. Appl. No. 15/141,010, filed Apr. 28, 2016, 8 pages.
Notice of Allowance dated Jan. 16, 2018, issued in connection with U.S. Appl. No. 15/140,945, filed Apr. 28, 2016, 5 pages.
Notice of Allowance dated Feb. 13, 2018, issued in connection with U.S. Appl. No. 15/141,010, filed Apr. 28, 2016, 5 pages.
United Kingdom Intellectual Property Office, Search Report dated Apr. 13, 2018, issued in connection with Great Britain Patent Application No. 1618347.7, 6 pages.

(56) References Cited

OTHER PUBLICATIONS

United Kingdom Intellectual Property Office, Search Report dated Apr. 17, 2018, issued in connection with Great Britain Patent Application No. 1618349.3, 7 pages.
United Kingdom Intellectual Property Office, Search Report dated Apr. 17, 2018, issued in connection with Great Britain Patent Application No. 1618352.7, 7 pages.
United Kingdom Intellectual Property Office, Search Report dated Apr. 13, 2018, issued in connection with Great Britain Patent Application No. 1618353.5, 6 pages.
United Kingdom Intellectual Property Office, Search Report dated Jun. 28, 2017, issued in connection with Great Britain Patent Application No. 1601306.2, 6 pages.
United Kingdom Intellectual Property Office, Search Report dated Aug. 16, 2017, issued in connection with Great Britain Patent Application No. 1607379.3, 6 pages.
United Kingdom Intellectual Property Office, Search Report dated Aug. 11, 2017, issued in connection with Great Britain Patent Application No. 1607380.1, 8 pages.
Australian Government, IP Australia, Examination Report No. 4 dated Sep. 28, 2018, issued in connection with Australian Patent Application No. 2017200271, 5 pages.
Australian Government, IP Australia, Examination Report No. 3 dated Jul. 23, 2018, issued in connection with Australian Patent Application No. 2017202574, 4 pages.
Australian Government, IP Australia, Examination Report No. 4 dated Jan. 15, 2019, issued in connection with Australian Patent Application No. 2017201574, 4 pages.
Australian Government, IP Australia, Examination Report No. 2 dated Aug. 9, 2018, issued in connection with Australian Patent Application No. 2017235913, 4 pages.
Australian Government, IP Australia, Examination Report No. 3 dated Jan. 15, 2019, issued in connection with Australian Patent Application No. 2017235913, 3 pages.
Australian Government, IP Australia, Examination Report No. 2 dated Jun. 25, 2018, issued in connection with Australian Patent Application No. 2017235921, 3 pages.
Australian Government, IP Australia, Examination Report No. 3 dated Sep. 28, 2018, issued in connection with Australian Patent Application No. 2017235921, 3 pages.
Australian Government, IP Australia, Examination Report No. 4 dated Jan. 31, 2019, issued in connection with Australian Patent Application No. 2017235921, 3 pages.
Australian Government, IP Australia, Examination Report No. 5 dated Mar. 4, 2019 issued in connection with Australian Patent Application No. 2017235921, 3 pages.
Australian Government, IP Australia, Examination Report No. 2 dated Aug. 21, 2018, issued in connection with Australian Patent Application No. 2017235939, 4 pages.
Australian Government, IP Australia, Examination Report No. 3 dated Jan. 18, 2019, issued in connection with Australian Patent Application No. 2017235939, 3 pages.
Australian Government, IP Australia, Examination Report No. 4 dated Mar. 6, 2019, issued in connection with Australian Patent Application No. 2017235939, 3 pages.
Australian Government, IP Australia, Examination Report No. 2 dated Jul. 24, 2018, issued in connection with Australian Patent Application No. 2017235945, 4 pages.
Australian Government, IP Australia, Examination Report No. 3 dated Feb. 4, 2019, issued in connection with Australian Patent Application No. 2017235945, 3 pages.
Australian Government, IP Australia, Examination Report No. 4 dated Mar. 5, 2019, issued in connection with Australian Patent Application No. 2017235945, 3 pages.
Australian Government, IP Australia, Examination Report No. 1 dated Oct. 12, 2018, issued in connection with Australian Patent Application No. 2018200695, 4 pages.
Canadian Intellectual Property Office, Examiner's Report dated Jan. 15, 2019, issued in connection with Canadian Patent Application No. 2,929,218, 6 pages.
Canadian Intellectual Property Office, Examiner's Report dated Nov. 1, 2018, issued in connection with Canadian Patent Application No. 2,954,790, 5 pages.
European Patent Office, Office Action dated Aug. 21, 2018, issued in connection with European Patent Application No. 17153144.5, 10 pages.
Non-Final Office Action dated Dec. 26, 2018, issued in connection with U.S. Appl. No. 15/392,946, filed Dec. 28, 2016, 13 pages.
Non-Final Office Action dated Jan. 16, 2019, issued in connection with U.S. Appl. No. 15/487,838, filed Apr. 14, 2017, 12 pages.
Non-Final Office Action dated Sep. 25, 2018, issued in connection with U.S. Appl. No. 16/056,721, filed Aug. 7, 2018, 10 pages.
Notice of Allowance dated Oct. 29, 2018, issued in connection with U.S. Appl. No. 15/487,022, filed Apr. 13, 2017, 5 pages.
Notice of Allowance dated Jul. 18, 2018, issued in connection with U.S. Appl. No. 15/487,869, filed Apr. 14, 2017, 9 pages.
Notice of Allowance dated Jan. 8, 2019, issued in connection with U.S. Appl. No. 16/056,721, filed Aug. 7, 2018, 5 pages.
Notice of Allowance dated Feb. 21, 2019, issued in connection with U.S. Appl. No. 16/056,721, filed Aug. 7, 2018, 7 pages.
United Kingdom Intellectual Property Office, Examination Report dated Jul. 30, 2018, issued in connection with Great Britain Patent Application No. 1701938.1, 6 pages.
United Kingdom Intellectual Property Office, Combined Search Report dated Sep. 20, 2017, issued in connection with Great Britain Patent Application No. 1607374.4, 7 pages.
Canadian Intellectual Property Office, Examination Report dated Nov. 1, 2021, issued in connection with Canadian Patent Application No. 3,088,444, 5 pages.
Australian Government, IP Australia, Examination Report No. 1 dated Mar. 28, 2017, issued in connection with Australian Patent Application No. 2016202966, 2 pages.
Australian Government, IP Australia, Examination Report No. 1 dated Mar. 29, 2017, issued in connection with Australian Patent Application No. 2016202965, 3 pages.
Australian Government, IP Australia, Patent Examination Report No. 1, dated Dec. 20, 2012, Issued in connection with Australian Patent Application No. 2011253848, 4 pages.
Australian Government, IP Australia, Examination Report No. 2 dated Jul. 14, 2017, issued in connection with Australian Patent Application No. 2016202966, 6 pages.
Canadian Intellectual Property Office, Examiner's Report dated Dec. 7, 2016, issued in connection with CA Application No. 2929222, 3 pages.
Canadian Intellectual Property Office, Office Action dated Mar. 13, 2017, issued in connection with Canadian Patent Application No. 2929218, 6 pages.
Canadian Intellectual Property Office, Examiner's Report dated Feb. 5, 2013, issued in connection with CA Application No. 2760112, 2 pages.
European Patent Office, European Search Report dated Jul. 27, 2016, issued in connection with EP Application No. 16171834.1, 8 pages.
European Patent Office, European Search Report dated Jun. 28, 2016, issued in connection with EP Application No. 16171832.5, 8 pages.
European Patent Office, Extended European Search Report dated Feb. 24, 2012, issued in connection with EP Application No. 11194636.4, 6 pages.
European Patent Office, Extended European Search Report dated Oct. 26, 2010, issued in connection with EP Application No. 10251152.4, 8 pages.
European Patent Office, Supplementary European Search Report dated Oct. 8, 2008, issued in connection with EP Application No. 05789874.4, 6 pages.
European Patent Office, Extended European Search Report dated Jun. 6, 2017, issued in connection with Application No. EP 17153144.5, 9 pages.
Final Office Action dated Sep. 14, 2012, issued in connection with U.S. Appl. No. 12/511,391, filed Jul. 29, 2009, 14 pages.
Final Office Action dated Jun. 23, 2010, issued in connection with U.S. Appl. No. 10/550,744, filed Aug. 24, 2006, 13 pages.

(56) References Cited

OTHER PUBLICATIONS

Final Office Action dated Sep. 28, 2009, issued in connection with U.S. Appl. No. 10/550,744, filed Aug. 24, 2006, 11 pages.
International Bureau, International Preliminary Report on Patentability dated Mar. 13, 2007, issued in connection with International Application No. PCT/IB2005/002678, filed on Sep. 9, 2005, 4 pages.
International Searching Authority, International Search Report and Written Opinion dated Jan. 16, 2007, issued in connection with International Application No. PCT/IB2005/002678, filed on Sep. 9, 2005, 8 pages.
Non-Final Office Action dated Jul. 31, 2013, issued in connection with U.S. Appl. No. 13/856,124, filed Apr. 3, 2013, 19 pages.
Non-Final Office Action dated Oct. 18, 2017, issued in connection with U.S. Appl. No. 15/140,945, filed Apr. 28, 2016, 11 pages.
Non-Final Office Action dated Apr. 4, 2008, issued in connection with U.S. Appl. No. 10/550,744, filed Aug. 24, 2006, 8 pages.
Non-Final Office Action dated Dec. 10, 2012, issued in connection with U.S. Appl. No. 12/974,690, filed Dec. 21, 2009, 25 pages.
Non-Final Office Action dated Dec. 24, 2009, issued in connection with U.S. Appl. No. 10/550,744, filed Aug. 24, 2006, 12 pages.
Non-Final Office Action dated Mar. 29, 2012, issued in connection with U.S. Appl. No. 12/511,391, filed Jul. 29, 2009, 10 pages.
Non-Final Office Action dated Nov. 29, 2013, issued in connection with U.S. Appl. No. 13/856,124, filed Apr. 3, 2013, 19 pages.
Notice of Allowability dated Nov. 26, 2010, issued in connection with U.S. Appl. No. 10/550,744, filed Aug. 24, 2006, 4 pages.
Notice of Allowance dated Mar. 11, 2013, issued in connection with U.S. Appl. No. 12/974,690, filed Dec. 21, 2009, 14 pages.
Notice of Allowance dated Apr. 10, 2014, issued in connection with U.S. Appl. No. 13/856,124, filed Apr. 3, 2013, 7 pages.
United Kingdom Intellectual Property Office, Combined Search Report and Abbreviated Examination Report dated Nov. 29, 2016, issued in connection with Application No. GB1509339.6, 7 pages.
United Kingdom Intellectual Property Office, Combined Search Report and Abbreviated Examination Report dated Nov. 29, 2016, issued in connection with Application No. GB1509340.4, 7 pages.
European Patent Office, Extended European Search Report dated Dec. 22, 2020, issued in connection with European Patent Application No. 20188196.8, 10 pages.
UK Intellectual Property Office, Combined Search Report dated Dec. 18, 2020, issued in connection with United Kingdom Application No. GB1910917.2, 5 pages.

\* cited by examiner

REAL-TIME CALCULATION OF EXPECTED VALUES TO PROVIDE MACHINE-GENERATED OUTPUTS PROPORTIONAL TO INPUTS

CROSS-REFERENCE TO RELATED APPLICATIONS

This application claims priority to United Kingdom patent application no. 1910917.2, filed on Jul. 31, 2019, which is hereby incorporated by reference as if fully set forth in this description.

FIELD

The present disclosure relates generally to systems and methods for signal processing and simulation.

BACKGROUND

Signal processing may be used in a plurality of contexts to, based on input signals, compute output signals according to one or more models. Signal processing may be carried out on signals that represent sound, images, biological measurements, or other physical properties. These signals may be analog or digital, linear or non-linear, and/or deterministic or statistical, among other possibilities. A plurality of parameters or attributes may determine or define the manner in which the signals are processed. These parameters or attributes may be adjusted over time to achieve desired signal processing effects. In cases where the signal processing is to be executed in real-time, near-real-time, or some approximation thereof, adjusting the parameters or attributes with sufficient speed may be challenging.

SUMMARY

In many applications, signal processing may be a time-sensitive process. For example, a computing device may be configured to process signals to be used as part of a simulation of an apparatus such as a robotic device, an autonomous vehicle, or another physical device or system. The simulation may include a plurality of iterations of a computation that generates output signals based on input signals. In order to simulate real-time operation or near-real time operation of the apparatus, each iteration of the computation (or some subset of the computation) may need to be executed within a predetermined period of time. Executing each iteration of the computation within the predetermined period of time may be especially important where results of the simulation are used to control the apparatus, or a device that represents or approximates the apparatus, in the real world. For example, the experience of users of the apparatus or the device that represents or approximates the apparatus may depend on the computation adhering to the predetermined period of time.

In the case of a robotic device, for example, this predetermined period of time may depend on a speed at which the robotic device is moving or a refresh rate sufficient to maintain the robotic device in balance, among other possibilities. Similarly, in the case of an autonomous vehicle, the predetermined period of time may depend on the speed at which the autonomous vehicle is traveling, the speed of other objects in an environment of the autonomous vehicle, or a rate at which the autonomous vehicle receives sensor data, among other possibilities. Thus, the predetermined period of time may vary based on the apparatus being simulated or the state in which the apparatus is being simulated, among other factors.

The computation may involve calculations that generate output signals based on input signals according to one or more models. In conventional implementations, parameters of the computation may be fixed or predetermined, and the computation may thus be configured to process the input signals in the same manner independently of the values of the input signals. In some cases, however, particular values of the input signals may necessitate modifications or adjustments to parameters of the computation. For example, simulating walking of a robotic device may involve executing the computation with a first set of parameters, while simulating running, turning, or jumping of the robotic device may involve executing the computation with a second different set of parameters.

In conventional implementations, modifying the parameters of the computation may involve determining and making such changes manually or, alternatively, providing multiple different computations for different contexts. Notably, however, such modification processes are unsuitable for real-time or near real-time simulations. Additionally, such modification processes are unsuitable for simulations in which the apparatus is to be simulated as capable of freely switching between two or more different operating modes. Notably, such modification processes might not allow for a continuous range of different operating modes, relying instead on discretely-defined operating modes.

Accordingly, provided herein are operations that allow modifications or adjustments to be automatically made to parameters of the computation based on input signals. Allowing modifications or adjustments to be made in this manner may allow the computation to more accurately simulate a desired behaviour of the apparatus under different circumstances (e.g., environmental conditions, control commands, etc.). Such automatic modifications may, for example, allow the computation to accurately simulate two or more different operating modes of the apparatus as part of a single simulation. Further, such automatic modifications may allow the computation to implement a continuous range of operating modes of the apparatus according to user or operator instructions. This continuous range of operating modes may be available instead of or in addition to any discretely-defined operating modes.

Accordingly, viewed from a first aspect, the disclosure provides a computer-implemented method. The method includes obtaining, by way of a user interface and for an iteration of a probabilistic computation that comprises a first output calculation and a second output calculation, a first input signal for the probabilistic computation and a second input signal representing a proportion of the first input signal to be allocated to the second output calculation. The method also includes, in response to obtaining the first input signal and the second input signal and based thereon, modifying parameters of the probabilistic computation within a predetermined period of time that simulates real-time operation of an apparatus. Modifying the parameters includes generating, by way of a first model, a first output signal that is statistically proportional to the combination of the first input signal and the second input signal. The first output signal represents a likelihood of a particular result being generated by the second output calculation. Modifying the parameters also includes generating a second output signal that adheres to constraints defined by a second model based on the second input signal. The second output signal represents an expected value percentage of the first output calculation such that a constant overall expected value percentage for the probabilistic computation is retained independently of the first input signal and the second input signal. Modifying the parameters further includes adjusting the likelihood of the particular result being generated by the second output calculation based on the first output signal and the expected value percentage of the first output calculation based on the second output signal. The method further includes executing, by simulation of the apparatus, the iteration of the probabilistic computation by performing the first output calculation and the second output calculation using the modified parameters.

The operations of the first aspect may be implemented as part of a simulation of a robotic device. For example, the probabilistic computation may be a computation of various output signals configured to control actuators of the robotic device. The computation may be statistical in order to take into account various sources of noise in the system and allow the simulation to be successfully executed in spite of this noise. The first calculation of the statistical computation may be directed to the forwards-backwards motion of the robot, while the second calculation may be directed towards the lateral motion of the robot.

The first input signal may represent a magnitude of an instruction directing the robot to walk, while the second input signal may represent a lateral component of a direction in which the robot is to walk. For example, the first input signal may indicate to move at 2.5 meters per second while the second input signal may indicate that 10% of this speed is to be lateral, thus also indirectly indicating that 90% of this speed is in the forwards-backwards direction. Thus, the product of the first signal and the second signal may represent a lateral motion vector according to which the robot is to move (e.g., 0.25 meters per second to the right).

As these input signals are received, the parameters of the computation may have to be adjusted in real-time or near-real-time in order to maintain the robot in balance in the simulation. A delay in processing of these signals may, for example, allow the robot to tip to a point where the robot can no longer be brought back into balance by moving a limb thereof.

The first output signal may represent a probability of the robot not falling over. The first model may thus represent one or more equations that balance the forces and moments acting on the robot. The second output signal may represent a force with which to actuate one or more actuators of the robot, and may be represented as a percentage of a maximum possible actuation force. The overall expected value percentage may represent, for example, a percentage of a maximum power that actuators of the robotic device are capable of exerting, with some of this power being reserved for the lateral direction and some for the forwards-backwards direction. Thus, the overall expected value percentage may remain constant regardless of how much of the commanded motion is lateral, although the lateral and forwards-backwards components may vary according to the input signals. Notably, in other implementations, the overall expected value percentage may represent another physical quantity associated with the robot, such as an expected deviation from a balanced state, among other possibilities.

Based on these output signals, the parameters of the probabilistic computation may be adjusted. An iteration of the modified probabilistic computation may then be executed to determine one or more output/control signals for controlling the robot. In some cases, the output/control signals associated with a successful simulation may be used to drive a physical robot.

Notably, the operations of the first aspect may additionally or alternatively be implemented in a plurality of other contexts. For example, the operations of the first aspect may be implemented as part of a simulation of an autonomous vehicle, weather simulation, or a wagering game. For example, the operations of the first aspect may be carried out to implement a wager game that allows for dynamic allocation of a wager between a base game feature and a progressive game feature (e.g., a jackpot).

Thus, viewed from a second aspect, the disclosure provides a computer-implemented method. The method includes providing a wager game for play by a user, the wager game including a base feature and a progressive feature. Additionally, the method includes obtaining, from a user or from memory, a wager amount for an iteration of the game. Further, the method includes receiving, from the user, a percentage of the wager amount to be allocated to the progressive feature. Still further, the method includes adjusting, by the gaming machine, the likelihood of winning an award associated with the progressive feature so that an expected value of the award to the user matches the value of the contribution made to the progressive feature.

Accordingly, the probabilistic computation of the first aspect may represent a reel-based wager game, the first output calculation may represent a base feature of the reel-based wager game, and the second output calculation may represent a progressive feature of the reel-based wager game. The first input signal may represent a wager amount, the second input signal may represent a percentage of the wager that is to be allocated to the progressive feature of the reel-based wager game, and the simulated apparatus may be a reel-based slot machine.

The first output signal may represent the expected trigger frequency of the progressive feature. Thus, the first model may represent the expected trigger frequency as a function of the expected payout per spin and the progressive feature jackpot value, where the expected payout per spin may be equal to the product of the wager and the progressive feature contribution percentage. Similarly, the second output signal and the expected value percentage may represent the return to player (RTP) of the base feature. The constant overall expected value percentage may represent a constant overall RTP for the reel-based wager game. Thus, the second model may represent the overall RTP as a function of the base feature RTP and the progressive feature contribution percentage.

In a third aspect, an article of manufacture may include a non-transitory computer-readable medium, having stored thereon program instructions that, upon execution by a computing device, cause the computing device to perform the operations of the first aspect or the second aspect.

In a fourth aspect, a computing device may include one or more processors, a memory component, and program instructions, stored in the memory component, that upon execution by the one or more processors, cause the computing device to perform the operations of the first aspect or the second aspect.

In a fifth aspect, a system may include a plurality of computing devices each including at least one display device, a first input device configured to generate a first input signal, and a second input device configured to generate a second input signal, one or more processors, and one or more memory devices storing a plurality of instructions executable by the one or more processors to perform the operations of the first aspect or the second aspect.

In a sixth aspect, a system may include various means for carrying out the operations of the first aspect or the second aspect.

In a seventh aspect, a computer program may include machine-readable instructions executable to cause a computing device to perform the operations of the first aspect or the second aspect.

In embodiments of the disclosure in which a computer software product is used, the product may be non-transitory and store instructions on physical media such as a DVD, or a solid state drive, or a hard drive. Alternatively, the product may be transitory and in the form of instructions provided over a connection such as a network connection which is linked to a network such as the Internet.

These aspects, as well as other embodiments, aspects, advantages, and alternatives will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

DETAILED DESCRIPTION

I. Introduction

Figure 1:
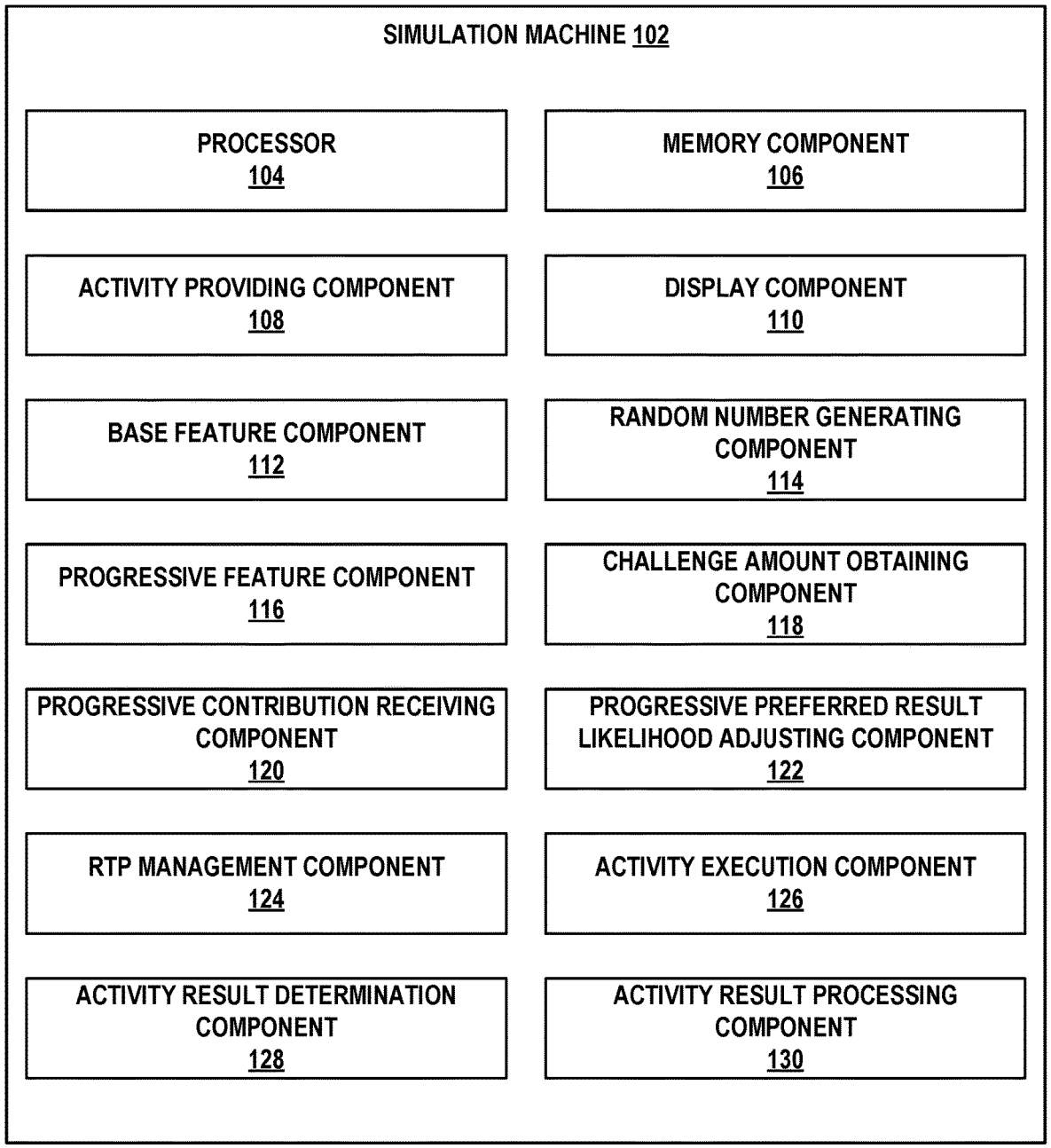
FIG. 1 is a simplified block diagram of an example gaming machine, in accordance with example embodiments.

Wager games come in a variety of forms, including for example a mechanical slot machine. A mechanical slot machine may include one or more reels, each of which includes a fixed pattern of symbols distributed around the circumference of the reel. When a player places a wager (for example, by placing a coin in the machine), the player is allowed to spin the reels. Each reel then comes to rest, typically with either one of the symbols, or a space in between symbols, in alignment with a pay line. A predefined winning symbol or a predefined combination of winning symbols that are aligned with the pay line can result in the player winning the game and receiving a pay-out. In one example, the machine may include three reels, and the pay line may be a horizontal line disposed across a centre of each of the three reels.

In another example of a wager game, a mechanical slot machine may present symbols in a matrix arrangement, with each symbol changing during a spin of the game according to the fixed pattern of symbols on the reels. For example, the machine may have five columns and three rows of symbols, for a total of fifteen symbols. Such machines often have multiple pay lines, each being defined by a collection of positions within the matrix. For example, the machine may have three pay lines, each corresponding to one row of the matrix.

While slot machines were traditionally mechanical, modern slot machines often take the form of a video gaming machine (for example, as a dedicated gaming machine located in a casino) that includes a graphical user interface (GUI), and that may emulate a mechanical slot machine. With a video gaming machine, the GUI may display an image of one or more reels or a matrix as described above, together with animation effects to simulate a spin of the one or more reels, or a spin of the columns or rows of the matrix. A computer software program, which may reside in the video gaming machine, may randomly select one or more symbols in response to a spin, and may display the selected one or more symbols on the display.

A modern slot machine may also be played over a computer network, such as by a player using a client machine that is connected to a server machine over the computer network. In this instance, the server machine may perform or simulate the spins of the game and may send the resulting symbols to the client machine for display.

Some wager games include a base feature and a progressive feature, which typically involves a jackpot. The jackpot may gradually increase in value as a part of each wager placed on the wager game is allocated to the jackpot, and may be paid out to a user that wins it. The rest of the wager funds the base feature. Generally, two types of progressive jackpot systems are known. In a first type, the size of a user's wager determines the size of the jackpot that they are eligible to win—for example, a $5 wager may allow the user to win 50% of the jackpot, whereas a $10 wager may allow the user to win 100% of the jackpot. In a second type, a user's odds of winning the jackpot increase with wager size. As an example, a $5 wager may provide a 1% chance of winning a jackpot, and a $10 wager may provide a 2% chance of winning the jackpot.

This description describes, among other things, example embodiments including, but not limited to, embodiments pertaining to performing aspects of an outcome event using a gaming machine with an interactive user interface and that provides a wager game that includes a base feature and a progressive feature. The gaming machine may obtain a wager amount and may receive, from the user, a percentage of the wager amount to be applied to the progressive feature. The gaming machine may then adjust a user's likelihood of winning an award associated with the progressive feature, typically a jackpot, so that an expected value of the award to the user matches the value of the contribution made to the progressive feature.

By way of example, the gaming machine may provide a wager game and a display area with details of the game. The gaming machine may obtain a wager amount. A user may be requested to provide such wager amount, and may then provide such a preferred amount to the gaming machine. Alternatively, the gaming machine may only allow a fixed wager, and this wager may be retrieved from memory. Then, the user may be allowed to specify a percentage of the wager that is to be contributed to the progressive feature of the game. A monetary value of the contribution to the progressive feature may then be used to calculate the likelihood of triggering a win of an award associated with the progressive feature. The award may be a jackpot. The value of the jackpot, multiplied by a likelihood of triggering it, may equal an expected pay-out of the jackpot to the user. Then, by setting the expected pay-out equal to the contribution to the progressive feature, the likelihood of winning the jackpot may be adjusted as the value of the jackpot is known. This is further explained below.

Furthermore, the wager game's RTP values may also be adjusted as the likelihood of triggering the jackpot is adjusted. For example, if the percentage of the wager contributed to the progressive jackpot is 10%, and the overall game RTP is 95%, the RTP of the base feature may be set to 85% for that instance of the game. For the same overall game RTP of 95%, but with a contribution to the progressive feature of 5%, the RTP of the base game may be adjusted to 90%. This ensures that the overall RTP of the game remains at 95% as is further detailed below.

Advantageously, the systems and methods disclosed herein provide a way of managing a wager game with a progressive jackpot feature that enables a user to control their desired contribution to an award associated with the progressive feature, as well as adjusting their chances of winning such award. By linking the contribution percentage to the likelihood of winning the award, the game remains fair to all players. Furthermore, by also adjusting the base game feature's RTP to be in line with the changing contribution percentage, the overall game RTP value is also kept the same, which may be desired, or even required by law. It also further contributes to fairness for all players of the game, whether the players are playing on the same gaming machine or on multiple connected gaming machines over a local or wide area network.

Throughout this description, the articles "a" or "an" are used to introduce elements of the example embodiments. Any reference to "a" or "an" refers to "at least one," and any reference to "the" refers to "the at least one," unless otherwise specified, or unless the context clearly dictates otherwise. The intent of using the conjunction "or" with a described list of at least two terms is to indicate any of the listed terms or any combination of the listed terms.

The use of ordinal numbers such as "first," "second," "third," and so on is to distinguish respective elements rather than to denote a particular order of those elements. For purpose of this description, the terms "multiple" and "a plurality of" refer to "two or more" or "more than one."

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

II. Example Architecture

FIG. 1 is a block diagram 100 depicting an example embodiment of a simulation machine 102 arranged to implement operations in accordance with example embodiments described herein. The simulation machine 102 may take any of a variety of forms, including for example a gaming machine dedicated to playing a wagering game, a personal computer, a server computer, a personal digital assistant, a mobile phone, a tablet device, or some other computing device. The simulation machine 102, when simulating a reel-based wagering game, may provide a reel-type slot machine with five reels, with each reel including a plurality of symbols.

The simulation machine 102 may be arranged to implement any of the methods as described herein. The simulation machine 102 may include a processor 104 arranged to execute the functions of various components, which may be provided by hardware or by software units executing on the simulation machine 102. The software units may be stored in a memory component 106, and instructions may be provided to the processor 104 to carry out the functionality of the described components. The various components can include an activity providing component 108, a display component 110, a base feature component 112, a random number generating component 114, a progressive feature component 116, a challenge amount obtaining component 118, a progressive contribution receiving component 120, a progressive preferred result likelihood adjusting component 122, an RTP management component 124, an activity execution component 126, an activity result determining component 128, and an activity result processing component 130.

The activity providing component 108 may be arranged to provide an activity such as a wager game that includes a base feature and a progressive feature. This component may provide multiple different games to a gaming machine.

The display component 110 may be arranged to provide a display area which may include a matrix of symbols. Columns of the matrix may represent reels of a game provided by the simulation machine 102. The display area may be provided on a display associated with the simulation machine 102.

The base feature component 112 may be arranged to provide the base feature of the wager game. The base feature may be, for example, a reel-based slot game that involves the spinning of reels, with the aim of the game being to have a plurality of symbols land in a manner that leads to a win for a user.

The random number generating component 114 may be arranged to determine a game outcome, for example, in a reel-based slot game, which symbols come to rest on the reels when they are brought to a stop. The gaming machine may employ virtual reel strips associated with the respective columns, with an arrangement of symbols being fixed thereon. The random number generating component 114 may determine which segment of each virtual reel strip is displayed in each column of the matrix when the symbols come to rest, and accordingly which symbols are displayed in the matrix after spinning of the reels.

The progressive feature component 116 may be arranged to provide the progressive feature of the wager game. The progressive feature may involve a part of each wager placed on every iteration of the game being allocated to a specific pool of funds, which may be associated with a jackpot. The pool may grow in size until the prize associated therewith, or the jackpot, is won by a user. The pool may be associated with a specific gaming machine, or with multiple machines which may be located at a single location where they are connected via a local network or which may be located over a large area where they are connected over a wide area network, for example the Internet.

The challenge amount obtaining component 118 may be arranged to obtain a value representing an amount from the user's funds to be wagered on an iteration of the game. The amount may be adjustable by the user, or may in fact be fixed by the gaming machine and stored in memory, in which case the amount will simply be the fixed amount every time the user instructs the game to proceed.

The progressive contribution receiving component 120 may be arranged to receive, from the user, a percentage of their wager that they wish to contribute towards the progressive feature of the wager game. The percentage may be adjustable to a maximum or minimum level, may be adjustable in fixed increments, or a user may be provided with a specific list of percentages that they may select from, such as, for example, five percent, ten percent and fifteen percent.

The progressive preferred result likelihood adjusting component 122 may be arranged to adjust the likelihood of the user winning a prize associated with the progressive feature, based on the value of their contribution to the progressive feature. An expected trigger frequency, or win likelihood, may be adjusted so that the expected payout per spin equals the user's contribution to the progressive feature. This is further explained below.

The return to player (RTP) management component 124 may be arranged to manage the RTP of the base game so that the overall RTP of the game remains the same. As a user changes the value of their contribution to the progressive feature, the value of their contribution to the base feature is also affected. The expected payout per spin for the base feature, and the expected payout per spin of the progressive feature may be combined to provide an expected payout per spin of the overall game, for example 95%. As a result, a change in the one requires a change in the other in order to keep the overall RTP constant. Again, this is further explained below.

The activity execution component 126 may be arranged to play an iteration of the wager game with the selected and adjusted game specifications. This may involve spinning of the reels of the gaming machine, and bringing them to a halt at positions determined by the random number generating component 114. This component may be linked or closely associated with the activity providing component 108.

The activity result determination component 128 may be arranged to determine a result of the game, considering the symbol positions on the reels, and the activity result processing component 130 may be arranged to process the result, for example facilitating payout of a win to the user, whether on the base feature or the progressive feature.

III. Example Operations

Figure 2:
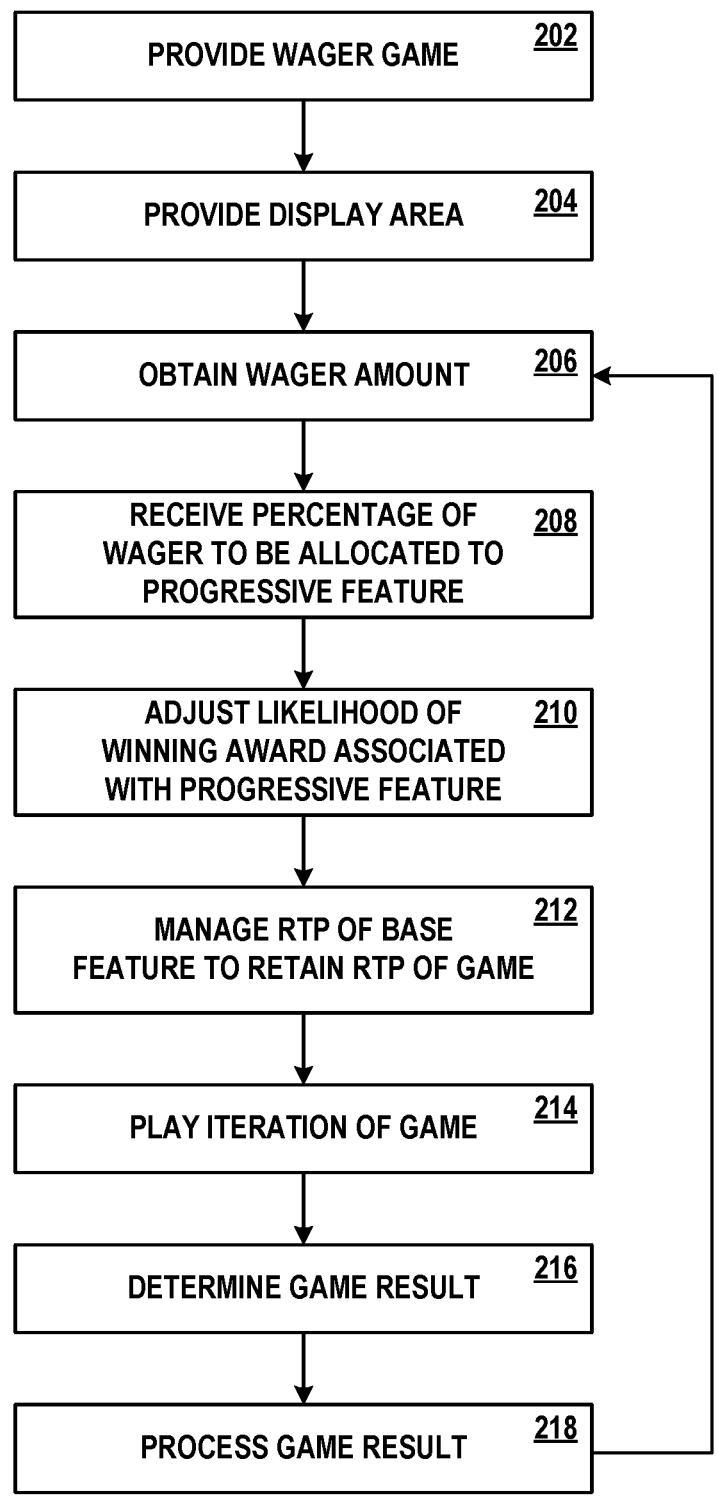
FIG. 2 is a flow chart, in accordance with example embodiments.

FIG. 2 depicts a flow diagram 200 that illustrates an example method that may be carried out using a gaming machine, such as the simulation machine 102 of FIG. 1. Operations of the method are shown within blocks 202 to 218. The example method can relate to performing outcome events, such as wager games. Any operation described below, or elsewhere in this description, with respect to FIG. 2, can be performed, at least in part, by a processor, such as the processor 104 executing software program instructions. In the embodiment detailed by the present flow diagram 200, the gaming machine may provide a wager game for play by a user, for example a reel-based slot game. The wager game may include a base feature, as well as a progressive feature. The base feature may, for example, include a reel-based slot game, and the progressive feature may have an award associated therewith. The award may be a jackpot, and may be funded via a percentage of bets placed on the wager game. In the present embodiment, the wager amount may be adjusted by the user, and the percentage of the wager to be contributed to the progressive feature may be adjusted by the user. The likelihood of winning the award associated with the progressive feature may be adjusted based on the value of the contribution, and the RTP value of the base feature may also be adjusted so that the overall RTP of the wager game remains the same.

Block 202 includes providing, by the gaming machine, a wager game. As mentioned above, in the present embodiment the wager game is a reel-based slot machine.

Block 204 includes providing, by the gaming machine, a display area on which elements of the wager game may be displayed to the user. The display area includes a matrix of symbols that includes at least one row and one column. In an example embodiment, it may have three rows and five columns. Each column may simulate a reel of a physical gaming machine.

Block 206 includes obtaining, by the gaming machine, a wager amount. The wager amount may be obtained from the user. The wager amount may be adjustable between a predetermined minimum and a predetermined maximum amount, may be adjustable in set increments, may be selectable from a list of predetermined values, or the like. In some embodiments, the wager amount may be fixed and may then be obtained from memory.

Block 208 includes receiving, by the gaming machine, a percentage of the obtained wager that is to be allocated to the progressive feature of the wager game. Where the progressive feature is a jackpot feature, this may be the percentage of the wager that is to be allocated to fund the jackpot. The percentage may be provided by the user, who may be allowed to choose from set percentages, or may adjust the percentage between an allowed maximum and minimum, possibly in set intervals. In some embodiments, as few as two set percentages may be provided, for example five percent and ten percent.

Block 210 includes adjusting, by the gaming machine, a likelihood of winning an award associated with the progressive feature based on the percentage of the wager that is allocated to fund the progressive feature.

If, for example, a user places a $1 wager, or bet, at block 206, and selects a five percent contribution to the progressive feature, their actual contribution to fund the progressive feature is $0.05. This may be illustrated by the following formula:

$$\text{Bet} \times (\text{Progressive contribution percentage}) = \text{Actual contribution per spin}$$

which, in this case, is:

$$\$1.00 \times 5\% = \$0.05$$

At the same time, a player may expect to benefit from an award associated with the progressive feature, generally a jackpot, according to the following formula:

$$(\text{Jackpot value}) \times (\text{Expected trigger frequency}) = \text{Expected payout per spin}$$

If the jackpot value is known, the expected trigger frequency may be determined by setting the expected payout per spin to be equal to the contribution per spin, from the above examples equal to $0.05. If the jackpot value is $500, the following formulas may be used to determine the desired trigger frequency:

$$\text{Expected trigger frequency} = \frac{\text{Expected payout per spin}}{\text{Jackpot value}} = \frac{\$0.05}{\$500} = 0.0001$$

which equals 0.01 percent.

Using the same wager and the same jackpot value, but a ten percent contribution to the jackpot, will provide the following actual contribution per spin:

Bet×(Progressive contribution percentage)=Actual contribution per spin $1.00×10%=$0.10

Then, by setting the actual contribution per spin equal to the expected payout, the expected trigger frequency may be determined as follows:

$$\text{Expected trigger frequency} = \frac{\text{Expected payout per spin}}{\text{Jackpot value}} = \frac{\$0.10}{\$500} = 0.0002$$

which equals 0.02 percent.

In the above example, a user may double their chance of winning the jackpot by doubling their contribution to the progressive feature. However, their RTP on the base feature of the wager game is reduced, as further explained below.

The adjustment of the expected trigger frequency must be done in near real-time in order to avoid an interruption in gameplay to a user. As a result, this concept requires computer-based implementation to be feasible. Namely, the adjustment of the expected trigger frequency may need to be completed in under a threshold period of time such as, for example, 1 second, 0.5 seconds, 0.25 seconds, or less. Similarly, adjustments to other parameters of the wager game simulation, such as the base feature RTP, may need to be completed in under the threshold period of time. If such adjustments take longer than the threshold period of time or some other predetermined period of time, the simulation may appear to lag, falter, stutter, or otherwise operate with some delay. In the case of a wager game simulation, such delayed adjustments may diminish the gameplay experience. In the case of simulations of another apparatus such as a robotic device or autonomous vehicle, such delayed adjustments may cause the apparatus to lose balance, collide with the environment, or otherwise operate in an undesirable manner.

Notably, while the examples above use round numbers for simplicity and clarity, other expected payout per spin and/or jackpot value combinations might result in the expected trigger frequency not being calculable in under the threshold period of time absent computer-based implementation. For example, when these values are represented as floating point values, a floating-point unit (FPU) of a computing device may be necessary to carry out the computation in under the threshold period of time. Further, analogous statistical computations in other contexts may need to process more complex input signals and/or may utilize more complex models for such processing, thus precluding non-computer-based implementations. For example, the input signals may be matrixes, time series, or other multi-dimensional data. Similarly, the models may include non-linear components or operations. Thus, real-time or near real-time simulations may necessitate computer-based implementation.

Block 212 includes managing, by the gaming machine, the RTP of the base feature in order to retain the overall RTP of the game at the same level, taking into account the adjusted RTP of the progressive feature.

As an example, the overall RTP of the wager game may be 0.95, or 95 percent. This means that a player will, on average, receive back 95 percent of all wagers placed on the wager game in the form of pay-outs, or wins. For example, if a user wagers a total of $10,000 on the wager game over a period of time, the user may expect to receive $9,500 back in winnings. However, it should be noted that this is an average, and during play over an extended period of time, a user may sometimes be in a position where they have received less than 95 percent back, and sometimes more than 95 percent. It will be apparent that a specific user's pay-out may vary, particularly when a progressive prize is involved that is funded by the contribution of various users, possibly over a wide area network such as the Internet.

The progressive feature may pay back all the money used to fund it, i.e. when $500 has been allocated to a prize or jackpot associated with the progressive feature after multiple wagers placed on the game, and that prize or jackpot is won, the full $500 is paid to the user that won the prize. Any percentage of a wager that is allocated to the progressive prize may therefore be considered to be paid back fully or, put another way, any part of a wager that is allocated to the progressive prize has a 100 percent RTP. The base feature RTP may therefore be adjusted to ensure the overall RTP of the game remains constant, which may be a legal or regulatory requirement.

The table below provides an example of how the RTP of the base game may be adjusted, based on, firstly, a wager with a five percent contribution to the progressive feature, and, secondly, a wager with a ten percent contribution to the progressive feature:

| Details | First example wager | Second example wager |
| --- | --- | --- |
| Progressive contribution percentage | 5% | 10% |
| Base feature RTP | 90% | 85% |
| Overall RTP | 95% | 95% |

In order to keep the overall wager game RTP constant, the base feature RTP must be adjusted as the contribution to the progressive feature is adjusted. If, for example, a $1 wager is made, and 5% of the wager is allocated to the progressive jackpot feature, the full five percent, or $0.05, will be paid out to a user when the jackpot is won. As 100% of the progressive contribution will be paid out, it adds 5 percent to the RTP of the overall wager game, or the overall RTP. Now, to keep the overall RTP at 95%, the RTP of the base feature should be set to 90% of the overall bet, or $0.90 of the total $1.00 wager. Combining the $0.05 (5%) and $0.90 (90%) provides $0.95 out of $1.00, or a 95% RTP. This mirrors the first example wager in the table above.

Similarly, when the progressive contribution is set to 10% (or $0.10 of a $1.00 wager) as shown with the second example wager above, the base feature RTP should be adjusted to 85% (or $0.85) of the overall bet of $1.00 to allow an overall RTP of 95% (or $0.95 pay out).

It should be noted that a round $1.00 wager was chosen for illustrative purposes, and that any wager value may be chosen. In addition, wagers may be in the form of playing credits instead of a direct monetary value. Regardless of the form of the wagers, however, the principles remain the same.

The adjustment of base feature RTP must also be done in near real-time in order to avoid an interruption in gameplay to a user. As a result, this concept requires computer-based implementation to be feasible. Some wager and progressive feature contribution percentages may lead to complex calculations to obtain a desired RTP, which further emphasises the need for computer-based implementation of this concept.

In some embodiments, a pay table associated with the base feature of the game may be modified to allow for a change in RTP of the base feature. This may allow the gaming machine to adjust the base feature RTP as required. In some other embodiments, the actual mechanics may be adjusted to keep the pay table the same, but to adjust the frequency of pay-outs on the base feature. This may, however, be more complicated that adjusting the pay table.

By managing the base feature RTP based on the contribution to the progressive feature, the RTP of the overall wager game may be kept constant. This may allow for adjustment of a progressive contribution percentage as desired by a user.

Once all parameters have been adjusted, managed, set, and/or selected, block 214 includes playing, by the gaming machine, an iteration of the game. In the present reel-based slot game, this involves spinning the reels of the gaming machine and bringing them to a halt in positions determined by a random number generator. In some embodiments, a spin instruction may be required from a user in order to initiate spinning of the reels of the gaming machine.

Block 216 then includes determining, by the gaming machine, a game result as a result of the positions of the reels and the symbols thereon.

Block 218 includes processing, by the gaming machine, the game result. This may involve paying a user as a result of a win, activating a bonus or special feature of the game, or the like. Then, the method may return to block 206, where the gaming machine may again obtain a wager amount and the method may repeat the next steps in the method to play an iteration of the game.

Any of the blocks of a flow diagram or a component in a block diagram may be provided by hardware or by software associated with the specific gaming machine, whether the multimedia computer, user's mobile device, or any server. The gaming machine may be embodied by a personal computer, laptop computer, personal digital assistant, smartphone, feature phone, satellite phone, server computer, phablet, tablet, wearable computer, or the like. Appropriate components may form part of such device for the operation of the required method on that device. Further, the gaming machine may be configured to communicate wirelessly or over a wired communication network. The various components forming part of the gaming machine may be configured to communicate with each other via an appropriate communication interface, while an appropriate external communication interface may facilitate communication with other electronic devices and/or gaming machines, whether forming part of the present systems or not.

Notably, the feature of allowing a user to select their contribution percentage to a progressive feature allows the user to adjust gameplay characteristics in line with their desired level of risk and reward. This may provide a better playing experience to the user. The user may, by adjusting their contribution to the progressive feature, also adjust their likelihood of winning a jackpot or prize associated with the progressive feature, whilst at the same time adjusting their RTP on the base feature. This ensures that the wager game may be considered fair, as a relatively higher contribution of a user to the progressive feature increases their likelihood of winning the progressive feature, whilst on average providing a lower immediate return on the base feature of the game.

By managing the overall RTP of the wager game, the game's return to player may also be kept fair, and may allow the game to comply with the necessary regulatory or legal requirements.

The present methods and systems may thus provide a progressive game feature wherein a user may adjust the parameters to suit their specific gameplay requirements, whilst still remaining fair and rewarding a user as appropriate for their selected parameters.

FIGS. 3 to 6 depict a gaming machine display (300) showing a graphical user interface (GUI) on which a game according to an exemplary embodiment may be played. Like reference numerals on FIGS. 3 to 6 represent like features and components. This exemplary embodiment is an implementation where a user may select between two different percentages to contribute to a progressive jackpot associated with a progressive feature of the wager game.

To simplify the explanation, only four different basic symbols are included in the matrix, notably Jacks (depicted by a "J"), Queens (depicted by a "Q"), Kings (depicted by a "K"), and Aces (depicted by a "A"). Special jackpot symbols, depicted by a "$" symbol and further explained below, are also provided. It will be apparent that many different types of symbols may be provided in other embodiments. The current wager game has an overall RTP of 95%.

Figure 3:
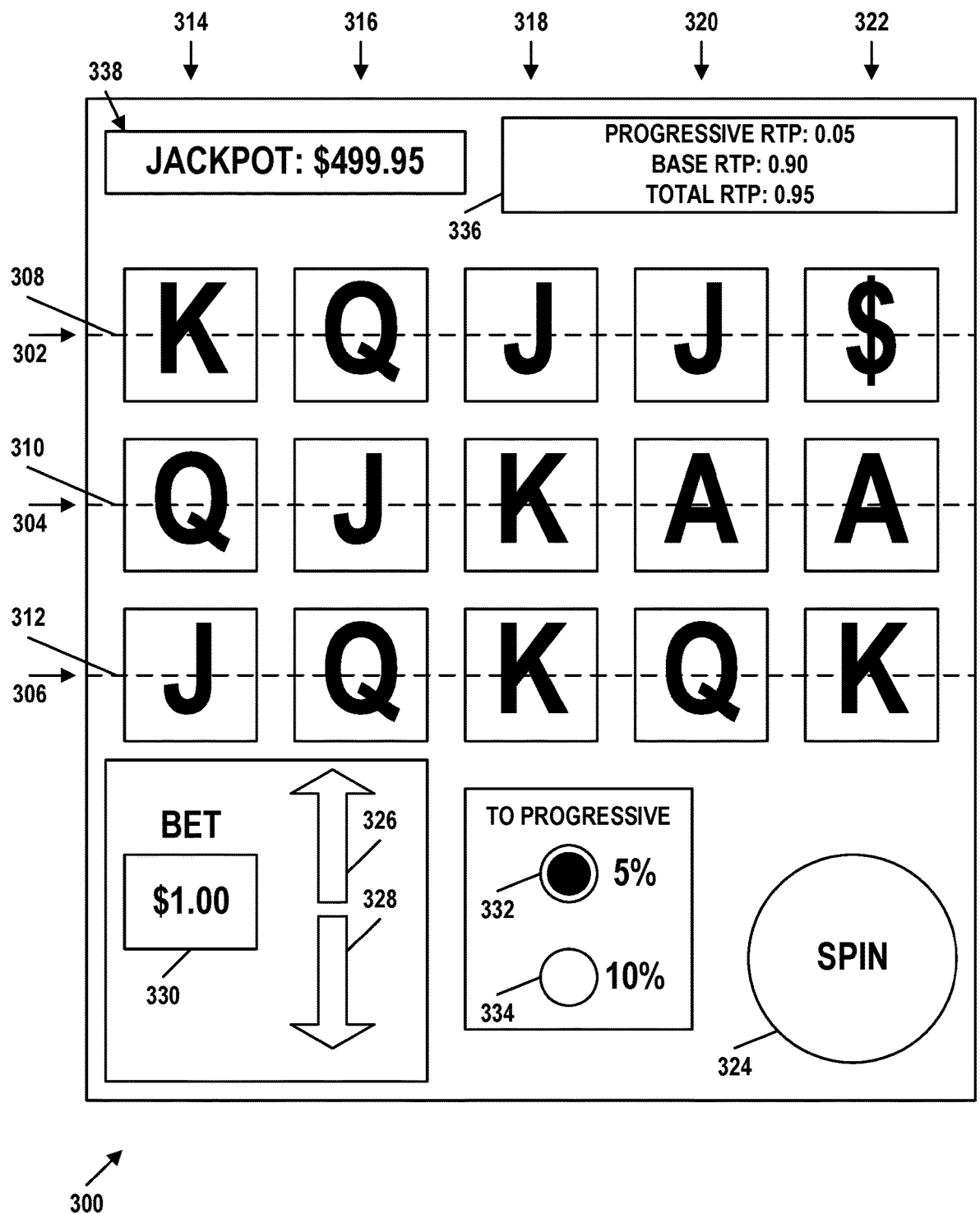
FIG. 3 is a first screenshot of a display screen, in accordance with example embodiments.

FIG. 3 shows the display (300) in a random state at a start of the game. The example wager game may be referred to as a "five reel" slot game having three pay lines. The base feature of the wager game is a reel-based slot game, and the progressive feature has a jackpot associated therewith. The jackpot is won when five jackpot symbols land on a pay line. A matrix of symbols is provided on the display. Three rows are provided in the matrix, as well as five columns. A pay line is provided on each of the three rows of the matrix. The three rows are numbered 302, 304 and 306, and pay lines 308, 310 and 312 are associated with rows 302, 304 and 306, respectively. The first column is indicated by numeral 314, the second by numeral 316, the third by numeral 318, the fourth by numeral 320, and the fifth by numeral 322.

A pay out may only occur if three or more of the same symbol land on a pay line, and then only taken from the first column at the far left towards the right. In other words, the first symbol of a combination may have to occur on the left-most column in order for the combination to trigger a pay out. Other embodiments may require other arrangements of winning combinations.

A spin button 324 is provided which may be selected by a user to provide a spin instruction and initiate an iteration of the game and spinning of the reels. A first upwards arrow button 326 allows a user to increase the size of a bet on a game, possibly to a limited maximum level, and a second downwards arrow button 328 allows a user to reduce the size of the user's bet, possibly to a limited minimum value. The bet level 330 is also shown to a user and is currently one dollar ($1.00).

Two radio buttons are provided with which a user may select a percentage of the wager that is to be allocated to the jackpot associated with the progressive feature. A first radio button 332 may be selected to allocate 5% to the jackpot, and a second radio button 334 may be selected to allocate 10% to the jackpot. In the present embodiment, only these two progressive contribution options are available for selection by a user.

An information window 336 details the RTP parameters to a user and may be updated based on the user's progressive contribution selection. This may be required by law or regulation in some jurisdictions. A jackpot value 338 is also shown on the display and is currently $499.95.

The buttons may be physical buttons associated with the gaming machine or may be provided on a touch-sensitive display screen, where the buttons may be selected by a user. Alternatively, a pointing device such as a computer mouse may be used to select the buttons when applicable.

A user may adjust the wager amount via the arrow buttons 326 or 328 to provide it to the gaming machine, and may select which percentage they wish to contribute to the progressive feature via the radio button 332 or 334. The gaming machine may then adjust the likelihood of the user winning the prize associated with the progressive feature, as explained with reference to FIG. 2.

As explained above, these values may be used to obtain a likelihood of winning the jackpot feature. To obtain an actual contribution per spin for the progressive feature, the same formula as before may be used:

Bet×(Progressive contribution percentage)=Actual contribution per spin which in this case is:

$1.00×5%=$0.05

Again, the user may expect to benefit from the jackpot of the progressive feature according to the following formula:

(Jackpot value)×(Expected trigger frequency)=Expected payout per spin

As the jackpot value will be $500 when the user's contribution of $0.05 is added thereto, the following formula may be used to determine and set the expected trigger frequency:

$$\text{Expected trigger frequency} = \frac{\text{Expected payout per spin}}{\text{Jackpot value}} = \frac{\$0.05}{\$500} = 0.0001$$

which equals 0.01 percent. The user's contribution will be added to the jackpot at the start of the spin, and therefore the higher jackpot may be used in calculating the likelihood of winning the jackpot.

The RTP of the base feature may also be adjusted, as also explained with reference to FIG. 2. With the current progressive contribution set to 5%, this will yield a base feature RTP of 90%, as the current wager game's RTP is 95%. This may be done by adjusting the value of wins according to a pay table of the wager game. The pay table may be visible to a user, as may be required and specified by law or regulation, as appropriate.

When a user selects the spin button 324, the reels may spin and come to rest in positions determined by a random number generator. Where initial parameters were provided by the gaming machine, for example those shown in FIG. 3, and the user did not adjust them, those initial parameters may be used by the gaming machine for the current iteration of the game.

Figure 4:
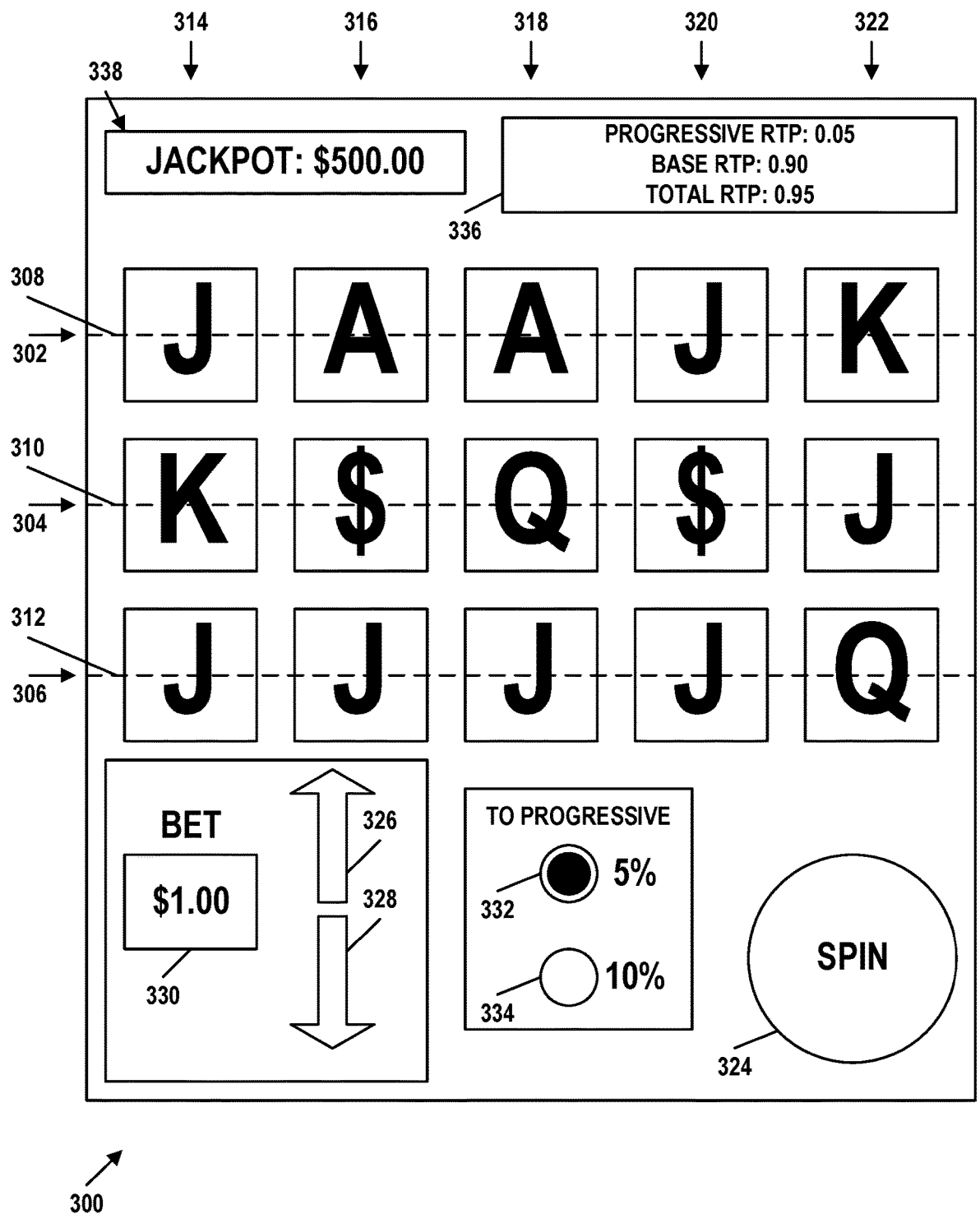
FIG. 4 is a second screenshot of a display screen, in accordance with example embodiments.

Moving then to FIG. 4, the user has selected the spin button 324, and the reels have spun and come to rest in the new positions shown. It should be noted that the jackpot prize has increased by $0.05 to $500.00, as the user's 5% contribution to the progressive feature was worth $0.05 on the $1.00 wager placed.

The gaming machine may determine the game result, and may notice that there are four Jack symbols from the left-most column on the third pay line 312 and the third row 306. As a result, the gaming machine may process an appropriate pay-out for four Jack symbols on a single pay line as per the appropriate pay table, which may be configured based on the required RTP of the base feature. The pay table may be visible to users. The base feature may be considered to be the entire slot-based game, excluding only the jackpot prize feature.

Figure 5:
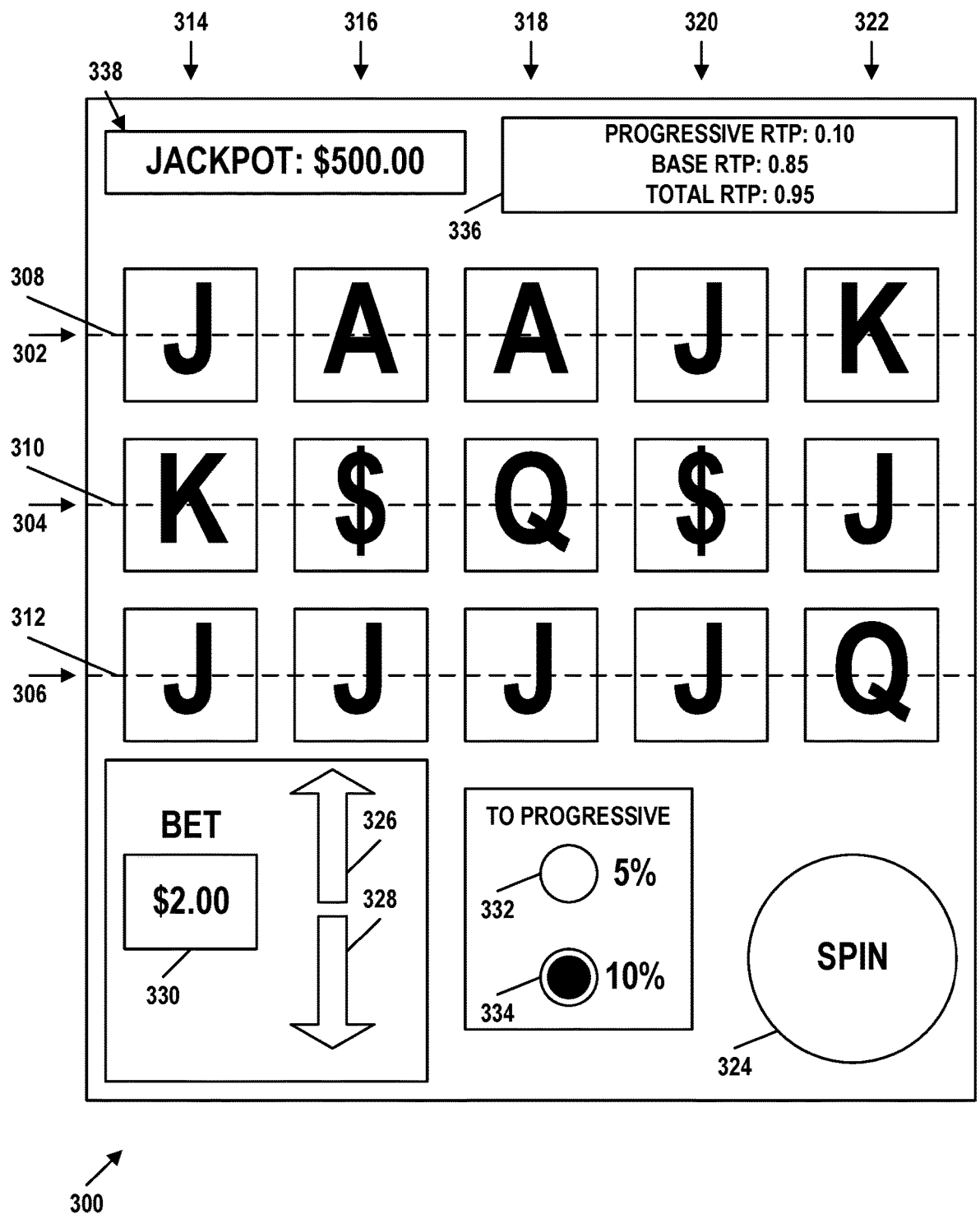
FIG. 5 is a third screenshot of a display screen, in accordance with example embodiments.

Moving then to FIG. 5, the user has now used the upwards arrow button 326 to adjust the wager amount to $2.00, and have selected the second radio button 334 to adjust their contribution to the jackpot to 10% of their wager, or $0.20. As explained above with reference to FIG. 2, these values may be used to obtain a likelihood of winning the jackpot feature. To obtain an actual contribution per spin for the progressive feature, the same formula as before may be used:

Bet×(Progressive contribution percentage)=Actual contribution per spin which in this case is:

$2.00×10%=$0.20

Again, the user may expect to benefit from the jackpot of the progressive feature according to the following formula:

(Jackpot value)×(Expected trigger frequency)=Expected payout per spin

As the jackpot value will be $500.20 when the user's contribution is added, the following formula may be used to determine and set the expected trigger frequency:

$$\text{Expected trigger frequency} = \frac{\text{Expected payout per spin}}{\text{Jackpot value}} = \frac{\$0.20}{\$500.20}$$

which is close to 0.04 percent.

The RTP of the base feature may then be adjusted. At a 10% contribution to the progressive feature, and a 95% RTP, the RTP of the base feature may be set to 85% with the appropriate pay table modifications.

The user may then select the spin button 324 to spin the reels at the set wager, and to bring the reels to a halt in their new positions as determined by a random number generator.

Figure 6:
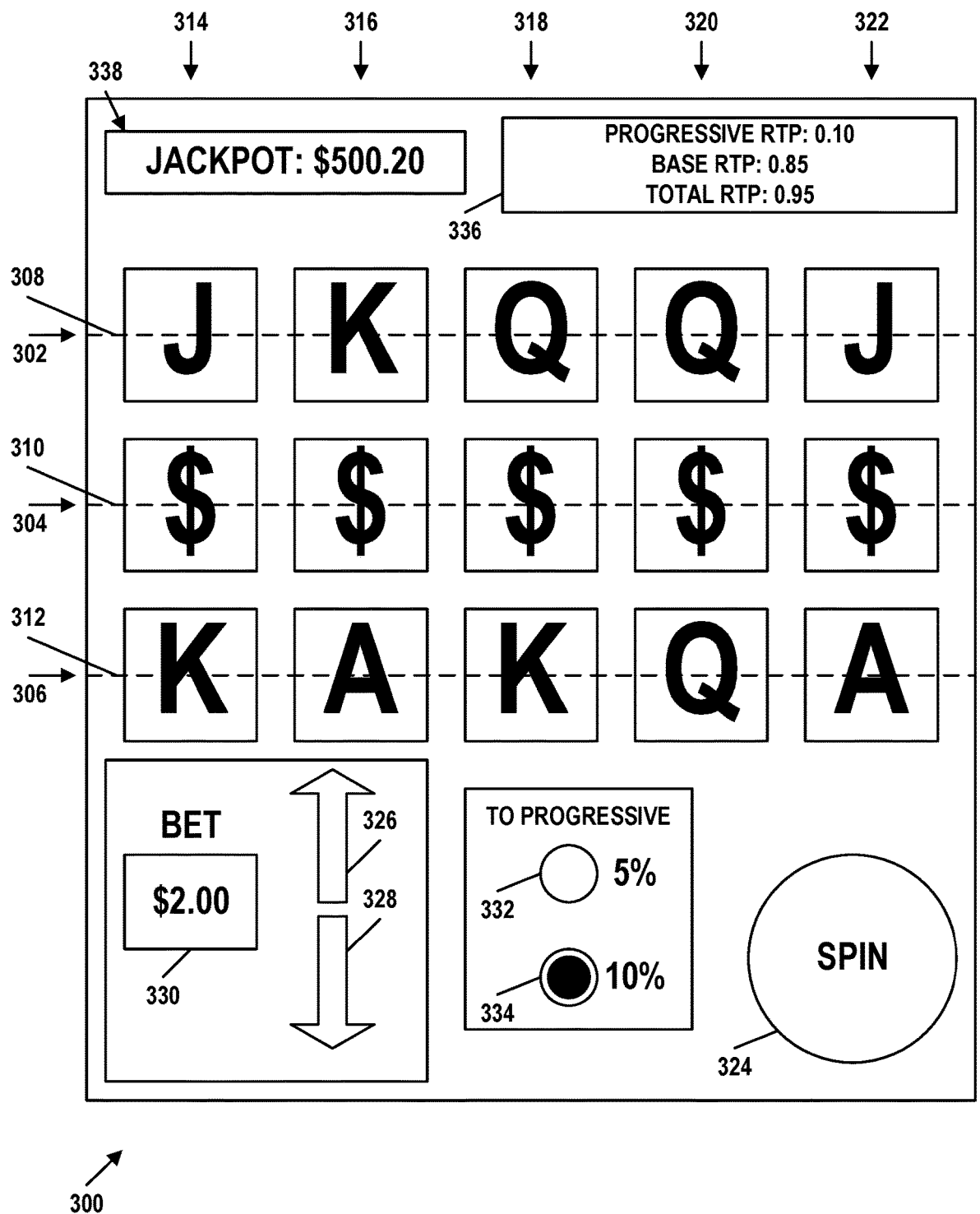
FIG. 6 is a fourth screenshot of a display screen, in accordance with example embodiments.

Moving then to FIG. 6, the reels have come to rest, with the Jackpot symbols ("$" symbols) filling the entire second pay line 310, and therefore the second row 304. The gaming machine will now determine that the user has won the Jackpot prize of $500.20. Then, the gaming machine may process a pay out of this jackpot prize to the user. The jackpot may then be cleared, and the progressive feature may need to restart from a $0.00 value. The jackpot value 338, as shown on the display, may then be updated.

The functionality to select a contribution percentage allows a player to configure the wager game to a format in line with their playing preferences, in particular the importance they place on the progressive feature of the game. The way in which the contribution percentage is linked to a likelihood of winning the progressive jackpot, and in which the base feature RTP is adjusted to keep the overall game RTP constant, provides a fair game implementation to all players. All players, at each iteration of the game, may expect to receive the same RTP, but players may choose to contribute to the different game features as desired. This may contribute to player excitement, but also allows for a fair game to all players despite its configurable elements. In addition, regulatory or legal requirements to retain a constant RTP for a game may be met by the described implementation.

In some embodiments, a user may place a wager in credits, rather than in a direct monetary amount. The methods of changing a wager or bet level, adjusting a percentage contribution to the progressive feature, and modifying pay tables and a likelihood of winning remains the same.

In some embodiments a jackpot symbol may have additional features. For example, it may function as a wild symbol and may substitute for any other symbol. This may lead to additional wins for a user in the base feature of the game in such embodiments.

While a 95% RTP value was used in the above embodiments, any RTP value may be chosen for a wager game, and may be used in implementing embodiments in accordance with the invention.

The award associated with the progressive feature, also known as a jackpot in some embodiments described above, is given as a single jackpot that may be won by a user. Some embodiments may involve more than one jackpot, which may be won in different ways, for example on different pay lines or the like. Funding models may involve different percentages of a wager going to such different jackpots, however, the basic feature that a user may select their contribution to the progressive feature may involve that a user may select their combined contribution to the more than one jackpots, which may then as a combination be considered a progressive feature. The actual contribution to the different jackpots may be determined by the gaming machine. Alternatively, a user may be able to specify to which of the jackpots they wish to contribute what percentage of their wager. This may allow for further modification of the user's gameplay settings, with the likelihood of winning the various jackpots then being individually updated in line with the appropriate contributions made thereto.

It should be noted that a prize associated with the progressive feature may be won in any number of ways, and need not be linked to a single symbol arrangement on the reels. A certain sequence of events in the base game, a specific alternative game feature, a bonus game, or the like may all be configured to allow the user to win the jackpot. The specific method in which the jackpot is won may depend on designer and game specification.

In some embodiments, a fixed wager amount may be used. Such wager may be stored in memory of the gaming machine and may be obtained from there during play of the game. The user may then only be allowed to adjust a percentage contribution to the progressive feature.

Some embodiments may allow a user to adjust a percentage contribution in different ways to that shown above. One embodiment is shown that only allows adjustment between two values using radio buttons. However, more options may be provided to a user, and upwards and downwards adjustment buttons may allow a user to finely adjust their contribution percentage, for example in 1% increments between 5% and 20%. The exact configuration options may depend on game designer preference.

The above embodiments only show the reels of the gaming machine to provide five column and three row matrixes, however, any possible matrix configuration may be provided. Any suitable configuration of pay lines may form part of the game, or it may even be a game in which symbols may land on any position in subsequent columns. Pay-outs may also be determined from right to left along a pay line instead of or in addition to determining pay-outs from left to right along a pay line.

Figure 7:
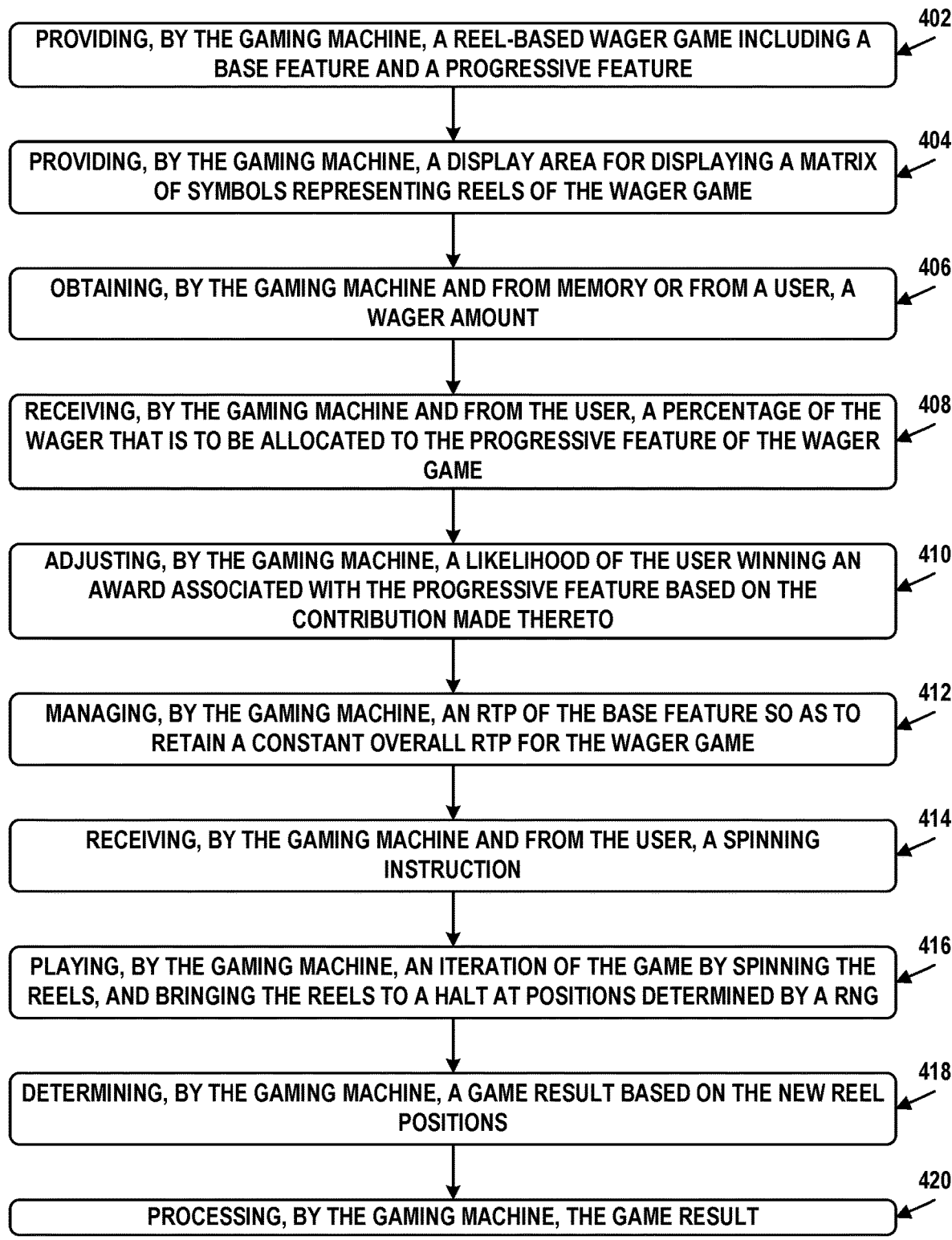
FIG. 7 is a flow chart, in accordance with example embodiments.
Figure 8:
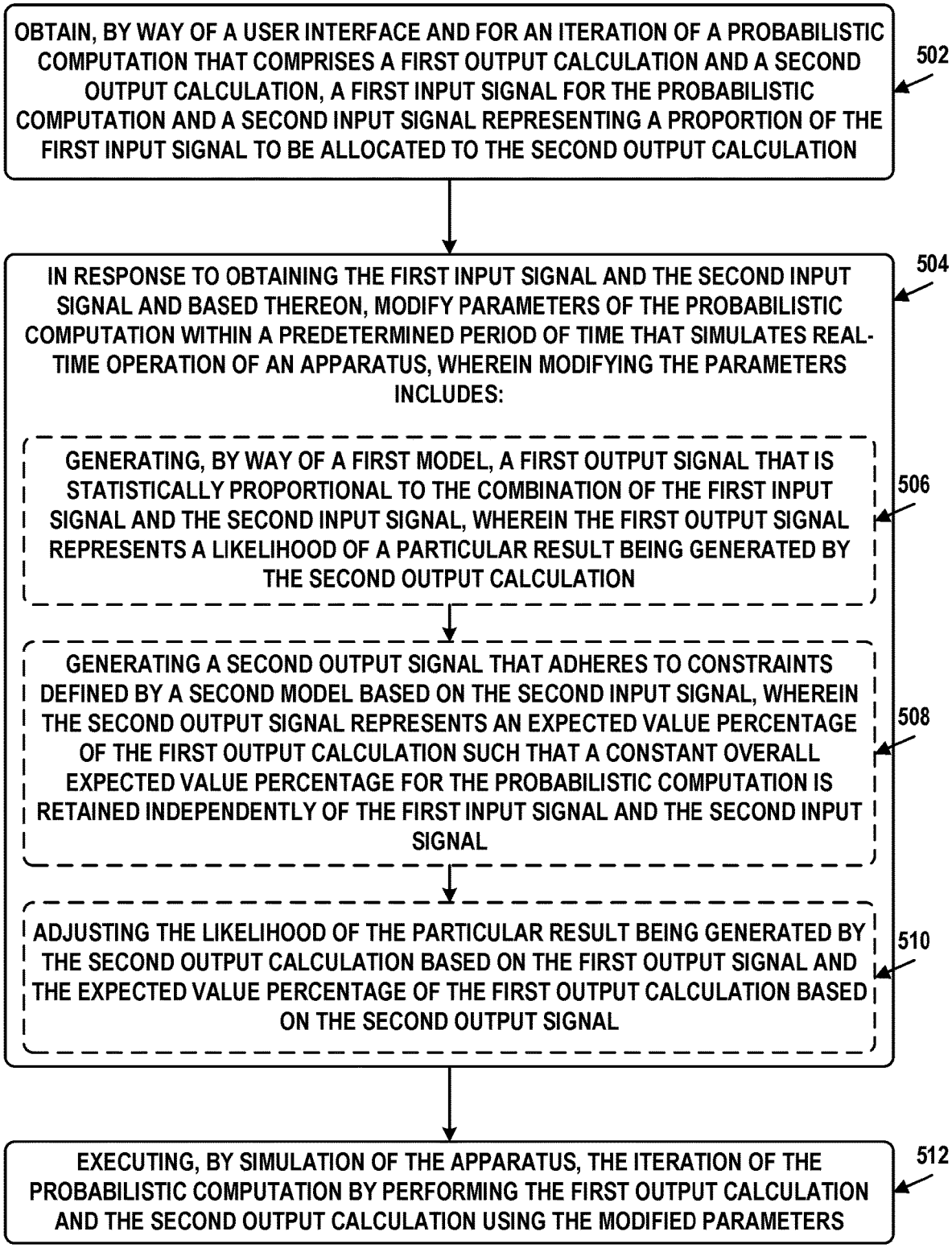
FIG. 8 is a flow chart, in accordance with example embodiments.

FIGS. 7 and 8 depict flow charts showing operations of methods 400 and 500, respectively, which can, for example, be carried out using simulation machine 102. In other examples, the operations of methods 400 or 500 could be carried out by a different computing device with a display. Additionally, certain aspects of methods 400 or 500 could also be carried out by a remote server as well. Furthermore, it is noted that the functionality described in connection with the flow charts can be implemented as special-function and/or configured general-function hardware modules, a computer program or portions of program code executed by a processor for achieving specific logical functions, determinations, and/or steps described in connection with the flow charts shown in FIGS. 7 and 8. Where used, program code can be stored on any type of computer-readable medium, for example, such as a storage device including a disk or hard drive.

In addition, each block of the flow charts shown in FIGS. 7 and 8 may represent circuitry that is wired to perform the specific logical functions in the process. Unless specifically indicated, functions in the flow charts shown in FIGS. 7 and 8 may be executed out of order from that shown or discussed, including substantially concurrent execution of separately described functions, or even in reverse order in some examples, depending on the functionality involved, so long as the overall functionality of the described method is maintained.

Referring now to FIG. 7, block 402 includes providing, by the gaming machine, a reel-based wager game including a base feature and a progressive feature.

Block 404 includes providing, by the gaming machine, a display area for displaying a matrix of symbols representing reels of the wager game.

Block 406 includes obtaining, by the gaming machine, and from memory or from a user, a wager amount to be placed on an iteration of the game.

Block 408 includes receiving, by the gaming machine and from the user, a percentage of the wager that is to be allocated to the progressive feature of the wager game.

Block 410 includes adjusting, by the gaming machine, a likelihood of the user winning an award associated with the progressive feature, typically a jackpot, based on the contribution made thereto.

Block 412 includes managing, by the gaming machine, an RTP of the base feature so as to retain a constant RTP for the overall wager game.

Block 414 includes receiving, by the gaming machine and from the user, a spinning instruction.

Block 416 includes playing, by the gaming machine, an iteration of the game by spinning the reels thereof, and bringing the reels to a halt at positions determined by a random number generator.

Block 418 includes determining, by the gaming machine, a game result based on the new reel positions.

Block 420 includes processing, by the gaming machine, the game result. This may involve a pay out if the result provides a win to a user.

Notably, the operations of method 400 allow three or more parameters of the reel-based wager game to be automatically modified when a user provides as few as one or two inputs. Namely, by specifying the wager and the percentage of this wager to be allocated to the progressive feature, method 400 generates adjustments to (i) the amount wagered on the base feature, (ii) the jackpot value, (iii) a likelihood of triggering the progressive feature, (iv) the progressive feature RTP, and (v) the base RTP. Thus, in implementations where the wager is fixed, a single player input causes at least five modifications to the reel-based wager game to be implemented. Further, as few as one or two user interface inputs allow the attributes of the reel-based wager game (e.g., probabilities associated with different aspects thereof) to be adjusted without having to pause or exit the reel-based wager game. Thus, a reel-based wager game may effectively provide the attributes that would otherwise only be available by playing multiple different instances of such reel-based wager games.

Referring now to FIG. 8, block 502 includes obtaining, by way of a user interface and for an iteration of a probabilistic computation that comprises a first output calculation and a second output calculation, a first input signal for the probabilistic computation and a second input signal representing a proportion of the first input signal to be allocated to the second output calculation.

Block 504 includes, in response to obtaining the first input signal and the second input signal and based thereon, modifying parameters of the probabilistic computation within a predetermined period of time that simulates real-time operation of an apparatus. Modifying the parameters includes executing the operations of blocks 506, 508, and 510.

Block 506 includes generating, by way of a first model, a first output signal that is statistically proportional to the combination of the first input signal and the second input signal. The first output signal represents a likelihood of a particular result being generated by the second output calculation.

Block 508 includes generating a second output signal that adheres to constraints defined by a second model based on the second input signal. The second output signal represents an expected value percentage of the first output calculation such that a constant overall expected value percentage for the probabilistic computation is retained independently of the first input signal and the second input signal.

Block 510 includes (i) adjusting the likelihood of the particular result being generated by the second output calculation based on the first output signal and (ii) the expected value percentage of the first output calculation based on the second output signal.

Block 512 includes executing, by simulation of the apparatus, the iteration of the probabilistic computation by performing the first output calculation and the second output calculation using the modified parameters.

In some embodiments, the probabilistic computation may be a reel-based wager game, the first output calculation may be a base feature of the reel-based wager game, and the second output calculation may be a progressive feature of the reel-based wager game. Thus, the first input signal may represent a wager amount, the second input signal may represent a percentage of the wager that is to be allocated to the progressive feature of the reel-based wager game, and the simulated apparatus may be a reel-based slot machine.

The first output signal may represent the expected trigger frequency of the progressive feature. Thus, the first model may include one or more of the following formulas:

$$\text{Expected trigger frequency} = \frac{\text{Expected payout per spin}}{\text{Jackpot value}}$$

$$\text{Expected payput per spin} = \text{Bet} \times (\text{Progressive contribution percentage})$$

The second output signal and the expected value percentage may represent the RTP of the base feature. The constant overall expected value percentage may represent a constant overall RTP for the reel-based wager game. Thus, the second model may include one or more of the following formulas:

Overall RTP=Base feature RTP+Progressive feature contribution percentage where the progressive feature RTP is equal to 100%, or Overall RTP=Base feature RTP+(Progressive feature RTP×Progressive feature contribution percentage)

where the progressive feature RTP is not equal to 100%.

IV. Example Signal Processing System

Figure 9:
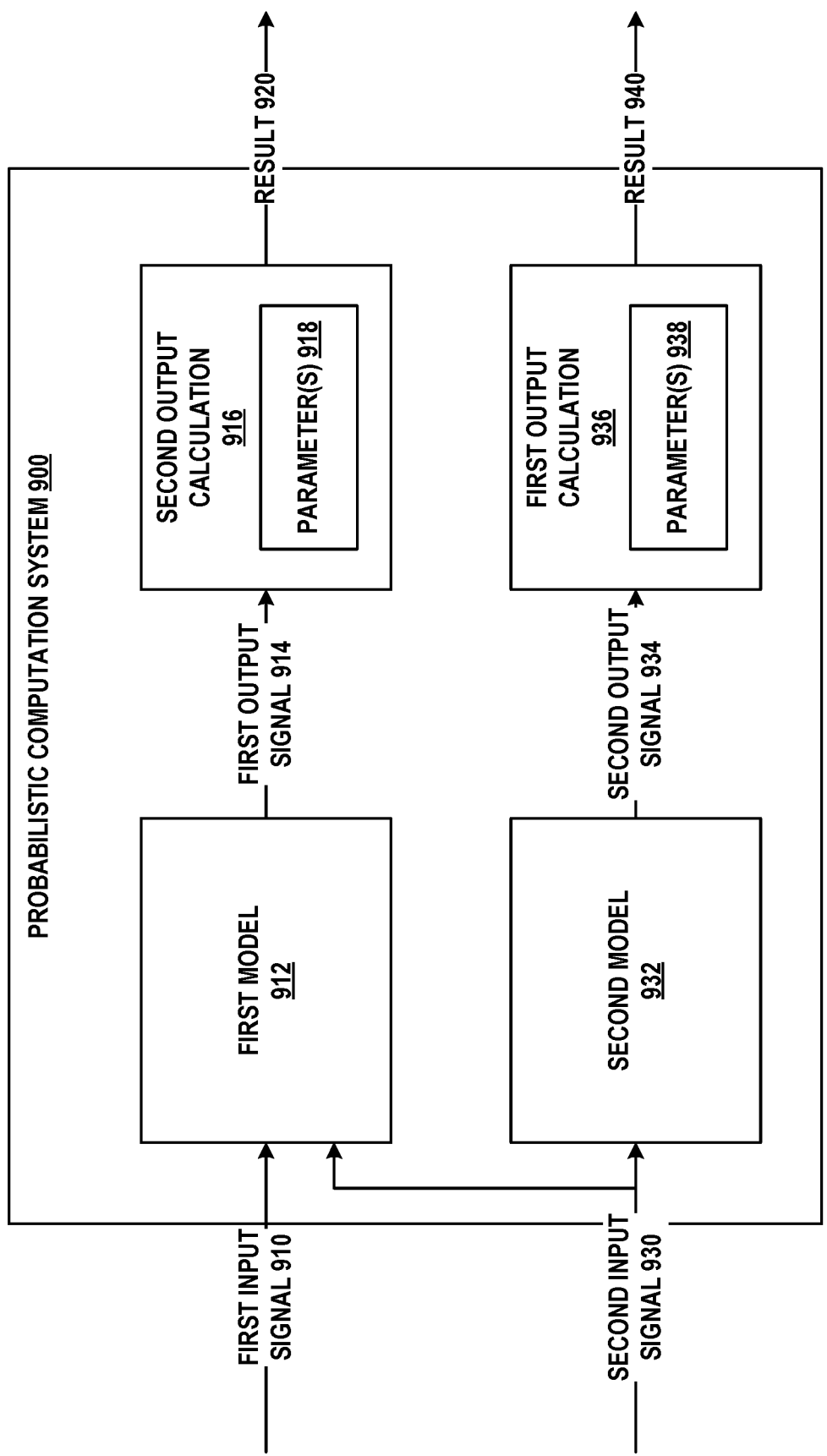
FIG. 9 illustrates a signal processing system, in accordance with example embodiments.

FIG. 9 illustrates an example signal processing system that may be used to carry out the operations herein described. Namely, FIG. 9 illustrates probabilistic computation system 900, which may be implemented as part of simulation machine 102 or another computing device, such as a remote server. Probabilistic computation system 900 may be implemented as special-function hardware modules, configured general-function hardware modules, or a computer program or portions of program code executed by a processor for achieving specific logical functions, determinations, and/or steps.

Probabilistic computation system 900 may include first model 912, second model 932, second output calculation 916, and first output calculation 936. First output calculation 936 and second output calculation 916 may be associated with parameter(s) 938 and 918, respectively. Parameter(s) 938 may define a manner in which first output calculation 936 is executed, while parameter(s) 918 may define a manner in which second output calculation 916 is executed. For example, the parameters may define mathematical properties of these calculations. In one example, parameter(s) 918 may include the likelihood of the particular result being generated by second output calculation 916, and parameter(s) 938 may include the expected value percentage of first output calculation 936.

Probabilistic computation system 900 may be configured to receive as input first input signal 910 and second input signal 930. First input signal 910 and second input signal 930 may be processed by first model 912 to generate first output signal 914. First output signal 914 may represent an updated value of the likelihood of the particular result being generated by second output calculation 916, and may be provided to second output calculation 916 to effectuate a modification to parameter(s) 918. Similarly, second input signal 930 may be processed by second model 932 to generate second output signal 934. Second output signal 934 may represent an updated value of the expected value percentage of first output calculation 936, and may be provided to first output calculation 936 to effectuate a modification to parameter(s) 938. In some implementations, second input signal 930 may also be provided to first model 912 and used in generation of first output signal 914.

Each of second output calculation 916 and first output calculation 936 may be configured to generate a corresponding result. Namely, second output calculation 916 may be configured to generate result 920 and first output calculation 936 may be configured to generate result 940. During some iterations, result 920 may be the particular result. Results 920 and 940 may collectively represent an output of an iteration of the probabilistic computation carried out by system 900. Thus, with each iteration, system 900 may receive updated values of first input signal 910 and second input signal 930, compute updated values of first output signal 914 and second output signal 934, modify parameters 918 and 938, and generate updated results 920 and 940 in accordance with these modifications.

V. Additional Example Embodiments

The following clauses are offered as further description of the disclosed embodiments.

(1) A computer-implemented method comprising:

obtaining, by way of a user interface and for an iteration of a probabilistic computation that comprises a first output calculation and a second output calculation, a first input signal for the probabilistic computation and a second input signal representing a proportion of the first input signal to be allocated to the second output calculation;

in response to obtaining the first input signal and the second input signal and based thereon, modifying parameters of the probabilistic computation within a predetermined period of time that simulates real-time operation of an apparatus, wherein modifying the parameters comprises:

generating, by way of a first model, a first output signal that is statistically proportional to the combination of the first input signal and the second input signal, wherein the first output signal represents a likelihood of a particular result being generated by the second output calculation, generating a second output signal that adheres to constraints defined by a second model based on the second input signal, wherein the second output signal represents an expected value percentage of the first output calculation such that a constant overall expected value percentage for the probabilistic computation is retained independently of the first input signal and the second input signal, and adjusting the likelihood of the particular result being generated by the second output calculation based on the first output signal and the expected value percentage of the first output calculation based on the second output signal; and executing, by simulation of the apparatus, the iteration of the probabilistic computation by performing the first output calculation and the second output calculation using the modified parameters.

(2) The computer-implemented method of clause 1, further comprising:

maintaining a running sum of products of the first input signal and the second input signal across multiple iterations, wherein the first model defines a first relationship between the combination of the first input signal and the second input signal, the running sum, and the first output signal such that the first output signal is statistically and inversely proportional to the running sum.

In implementations relating to reel-based wager games, the running sum may represent the jackpot value.

(3) The computer-implemented method of clause 2, further comprising:

determining that the second output calculation generated the particular result; and based on determining that the second output calculation generated the particular result, resetting the running sum to zero.

In implementations relating to reel-based wager games, resetting the running sum to zero may be associated with paying out the jackpot amount to a user.

(4) The computer-implemented method of any of clauses 2-3, wherein the running sum is maintained for multiple iterations of the probabilistic computation across a plurality of different simulations of the apparatus.

In implementations relating to reel-based wager games, the different simulation of the apparatus may represent multiple different instances of the reel-based wager game. Thus, wagers from multiple different wager games may be pooled together to generate the jackpot.

(5) The computer-implemented method of any of clauses 1-4, wherein the combination of the first input signal and the second input signal comprises a product of the first input signal and the second input signal.

In implementations relating to reel-based wager games, the product may represent an amount of the wager contributed to the progressive feature (e.g., to the jackpot).

(6) The computer-implemented method of any of clauses 1-5, wherein the second model defines a second relationship between the expected value percentage of the first output calculation, an expected value percentage of the second output calculation weighted based on the second input signal, and the constant overall expected value percentage for the probabilistic computation.

(7) The computer-implemented method of any of clauses 1-6, wherein the constant overall expected value percentage for the probabilistic computation is a sum of (i) the expected value percentage of the first output calculation and (ii) a product of the expected value percentage of the second output calculation multiplied by the second input signal.

(8) The computer-implemented method of any of clauses 1-7, further comprising:

determining that the second output calculation generated the particular result; and based on determining that the second output calculation generated the particular result, providing for display, by way of the user interface, a visual representation associated with the particular result.

In implementations relating to reel-based wager games, the particular result may trigger the jackpot. Thus, the visual representation may indicate that the jackpot has been won.

(9) The computer-implemented method of any of clauses 1-7, further comprising:

determining that the first output calculation generated a first result of a plurality of predetermined results; and based on determining that the first output calculation generated the first result, providing for display, by way of the user interface, a visual representation associated with the first result.

In implementations relating to reel-based wager games, the plurality of predetermined results may represent winning symbol combinations arranged along a pay line.

(10) The computer-implemented method of any of clauses 1-9, wherein a server device is configured to obtain the first input signal and the second input signal, modify parameters of the probabilistic computation, and execute the iteration of the probabilistic computation on behalf of a computing device configured to provide the user interface and display the simulation of the apparatus.

(11) The computer-implemented method of any of clauses 1-10, wherein executing the iteration of the probabilistic computation comprises displaying a visual animation of the first output calculation.

In implementations relating to reel-based wager games, the visual animation of the first output calculation may be an animation of spinning reels.

(12) The computer-implemented method of any of clauses 1-11, wherein executing the iteration of the probabilistic computation comprises displaying a visual animation of the second output calculation.

In implementations relating to reel-based wager games, the visual animation of the second output calculation may be an animation of spinning reels, with a portion of the symbols on these reels being the jackpot symbols (e.g., the "$" symbols).

(13) The computer-implemented method of any of clauses 1-12, wherein performing the first output calculation comprises:

selecting, based on the second output signal, a first set of values to define a first portion of a matrix, wherein a probability that first portion of the matrix comprises at least a first arrangement of values of a plurality of predetermined arrangements of values is based on the second output signal.

In implementations relating to reel-based wager games, the matrix may represent, for example, five columns and three rows of symbols, for a total of fifteen symbols. Thus, the values of the first portion of the matrix may represent base feature symbols selected for the various symbol positions within the first portion of the matrix.

(14) The computer-implemented method of clause 13, wherein performing the second output calculation comprises:

selecting, based on the first output signal, a second set of values to define a second portion of the matrix different from the first portion, wherein the particular result comprises the second portion of the matrix including at least a second arrangement of values of the plurality of predetermined arrangements of values.

In implementations relating to reel-based wager games, the values of the second portion of the matrix may represent jackpot symbols selected for the various symbol positions within the second portion of the matrix. Notably, the extent of the first portion of the matrix and the second portion of the matrix may vary according to the matrix positions for which jackpot symbols are selected.

(15) The computer-implemented method of any of clauses 1-14, wherein obtaining the first input signal comprises:

providing for display, by way of the user interface, a first plurality of candidate values for the first input signal; and receiving, by way of the user interface, a first selection of at least one value of the first plurality of candidate values.

(16) The computer-implemented method of any of clauses 1-15, wherein obtaining the second input signal comprises:

providing for display, by way of the user interface, a second plurality of candidate values for the second input signal; and receiving, by way of the user interface, a second selection of at least one value of the second plurality of candidate values.

(17) The computer-implemented method of any of clauses 1-14 or 16, wherein the first input signal is fixed and the second input signal is selectable by way of the user interface.

(18) The computer-implemented method of any of clauses 1-17, wherein executing the iteration of the probabilistic computation comprises:

receiving, by way of the user interface, instructions to initiate the simulation of the apparatus; and in response to reception of the instructions to initiate the simulation of the apparatus, executing the iteration of the probabilistic computation.

In implementations relating to reel-based wager games, the instructions may be generated in response to selection of a spin button.

(19) The computer-implemented method of any of clauses 1-18, wherein the first output calculation and the second output calculation are independent of one another.

In implementations relating to reel-based wager games, an outcome of the base feature may be selected independently of an outcome of the progressive feature. Thus, a determination of whether the jackpot is won may be independent of the base feature outcome.

(20) The computer-implemented method of any of clauses 1-18, wherein a result of the second output calculation depends on a result of the first output calculation.

In implementations relating to reel-based wager games, the base feature outcome and the progressive feature outcome may be co-determined. For example, these two outcomes may be selected using a single module or a single random number generator.

(21) An article of manufacture including a non-transitory computer-readable medium, having stored thereon program instructions, that upon execution by a computing device, cause the computing device to perform operations of any of clauses 1-20.

(22) A computing device comprising:
one or more processor;
a memory component; and
program instructions, stored in the memory component, that upon execution by the one or more processor, cause the computing device to perform operations of any of clauses 1-20.

(23) A system comprising:
a plurality of computing devices each including at least one display device, a first input device configured to generate a first input signal, and a second input device configured to generate a second input signal;
one or more processors; and
one or more memory devices storing a plurality of instructions executable by the one or more processors to perform operations of any of clauses 1-20.

(24) A system comprising means for performing operations of any of clauses 1-20.

VI. Conclusion

This detailed description describes various features and functions of the disclosed systems, devices, and methods with reference to the accompanying figures. In the figures, similar symbols typically identify similar components, unless context dictates otherwise. The illustrative embodiments described in the detailed description, figures, and claims are not meant to be limiting. Other embodiments can be used, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flow charts in the figures and as discussed herein, each step, block and/or communication can represent a processing of information and/or a transmission of information in accordance with example embodiments. Alternative embodiments are included within the scope of these example embodiments. In these alternative embodiments, for example, functions described as steps, blocks, transmissions, communications, requests, responses, and/or messages can be executed out of order from that shown or discussed, including in substantially concurrent or in reverse order, depending on the functionality involved. Further, more or fewer steps, blocks and/or functions can be used with any of the message flow diagrams, scenarios, and flow charts discussed herein, and these message flow diagrams, scenarios, and flow charts can be combined with one another, in part or in whole.

A step or block that represents a processing of information can correspond to circuitry that can be configured to perform the specific logical functions of a herein-described method or technique. Additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer-readable medium such as a storage device including a disk or hard drive or other storage media.

The computer-readable medium can include non-transitory computer-readable media such as computer-readable media that stores data for short periods of time like register memory, processor cache, and/or random access memory (RAM). The computer-readable media can include non-transitory computer-readable media that stores program code and/or data for longer periods of time, such as secondary or persistent long term storage, like read only memory (ROM), optical or magnetic disks, and/or compact-disc read only memory (CD-ROM), for example. The computer-readable media can be any other volatile or non-volatile storage systems. A computer-readable medium can be considered a computer-readable storage medium, for example, or a tangible storage device.

Software for use in carrying out the invention can also be in transitory form, for example in the form of signals transmitted over a network such as the Internet. Moreover, a step or block that represents one or more information transmissions can correspond to information transmissions between software and/or hardware modules in the same physical device. However, other information transmissions can be between software modules and/or hardware modules in different physical devices.

Further, the described operations throughout this application need not be performed in the disclosed order, although in some examples, the recited order may be preferred. Also, not all operations need to be performed to achieve the desired advantages of disclosed machines and methods, and therefore not all operations are required.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

While examples have been described in terms of select embodiments, alterations and permutations of these embodiments will be apparent to those of ordinary skill in the art. Other changes, substitutions, and alterations are also possible without departing from the disclosed machines and methods in their broader aspects as set forth in the following claims.

What is claimed is:

1. A computer-implemented method comprising:
obtaining, by way of a user interface and for an iteration of a probabilistic computation of a wager game that comprises (i) a base feature associated with a first output calculation and (ii) a progressive feature associated with a second output calculation, a first input signal representing a wager amount for the probabilistic computation and a second input signal representing a proportion of the first input signal to be allocated to the second output calculation of the progressive feature, wherein the probabilistic computation is associated with initial parameters for executing the base feature and the progressive feature;

in response to obtaining the first input signal and the second input signal and based thereon, determining updated parameters of the probabilistic computation by:
generating, by way of a first model associated with the progressive feature, a first output signal that is statistically proportional to the combination of the first input signal and the second input signal, wherein the first output signal represents a likelihood of a particular result being generated by the second output calculation, and wherein the particular result is configured to trigger the progressive feature, and
generating a second output signal that adheres to constraints defined by a second model based on the second input signal, wherein the second model is associated with the base feature, and wherein the second output signal represents an expected value percentage of the first output calculation such that a constant overall expected value percentage for the probabilistic computation is retained independently of the first input signal and the second input signal,
modifying the probabilistic computation by replacing the initial parameters with the updated parameters and within a predetermined period of time that simulates real-time operation of an apparatus configured to provide the wager game, wherein modifying the probabilistic computation comprises changing, for the iteration of the probabilistic computation, the likelihood of the particular result being generated by the second output calculation based on the first output signal and changing, for the iteration of the probabilistic computation, the expected value percentage of the first output calculation based on the second output signal;
executing, by simulation of the apparatus configured to provide the wager game, the iteration of the probabilistic computation of the wager game by performing, using the probabilistic computation as modified, the first output calculation as part of the base feature of the wager game and the second output calculation as part of the progressive feature of the wager game; and
causing the user interface to display a visual representation of the simulation of the apparatus, wherein the visual representation comprises an animation of a matrix representing results of performing the first output calculation as part of the base feature of the wager game and the second output calculation as part of the progressive feature of the wager game.

2. The computer-implemented method of claim 1, further comprising:
maintaining a running sum of products of the first input signal and the second input signal across multiple iterations, wherein the first model defines a first relationship between the combination of the first input signal and the second input signal, the running sum, and the first output signal such that the first output signal is statistically and inversely proportional to the running sum.

3. The computer-implemented method of claim 2, further comprising:
determining that the second output calculation generated the particular result; and
based on determining that the second output calculation generated the particular result, resetting the running sum to zero.

4. The computer-implemented method of claim 2, wherein the running sum is maintained for multiple iterations of the probabilistic computation across a plurality of different simulations of the apparatus to represent a value of the progressive feature.

5. The computer-implemented method of claim 1, wherein the combination of the first input signal and the second input signal comprises a product of the first input signal and the second input signal.

6. The computer-implemented method of claim 1, wherein the second model defines a second relationship between the expected value percentage of the first output calculation, an expected value percentage of the second output calculation weighted based on the second input signal, and the constant overall expected value percentage for the probabilistic computation.

7. The computer-implemented method of claim 1, wherein the constant overall expected value percentage for the probabilistic computation is a sum of (i) the expected value percentage of the first output calculation and (ii) a product of an expected value percentage of the second output calculation multiplied by the second input signal.

8. The computer-implemented method of claim 1, further comprising:
   determining that the second output calculation generated the particular result; and
   based on determining that the second output calculation generated the particular result, providing for display, by way of the user interface, a visual representation associated with the particular result.

9. The computer-implemented method of claim 1, further comprising:
   determining that the first output calculation generated a first result of a plurality of predetermined results; and
   based on determining that the first output calculation generated the first result, providing for display, by way of the user interface, a visual representation associated with the first result.

10. The computer-implemented method of claim 1, wherein a server device is configured to obtain the first input signal and the second input signal, determine the updated parameters, modify the probabilistic computation, and execute the iteration of the probabilistic computation on behalf of a computing device configured to provide the user interface and display the simulation of the apparatus.

11. The computer-implemented method of claim 1, wherein performing the first output calculation comprises:
   selecting, based on the second output signal, a first set of values to define a first portion of the matrix, wherein a probability that the first portion of the matrix comprises at least a first arrangement of values of a plurality of predetermined arrangements of values is based on the second output signal.

12. The computer-implemented method of claim 11, wherein performing the second output calculation comprises:
   selecting, based on the first output signal, a second set of values to define a second portion of the matrix different from the first portion, wherein the particular result comprises the second portion of the matrix including at least a second arrangement of values of the plurality of predetermined arrangements of values.

13. The computer-implemented method of claim 1, wherein obtaining the second input signal comprises:
   providing for display, by way of the user interface, a second plurality of candidate values for the second input signal; and
   receiving, by way of the user interface, a second selection of at least one value of the second plurality of candidate values.

14. The computer-implemented method of claim 1, wherein the visual representation comprises at least one parameter on which a subsequent iteration of the probabilistic computation is based, and wherein the at least one parameter is based on a result of performing the second output calculation.

15. An article of manufacture including a non-transitory computer-readable medium, having stored thereon program instructions, that upon execution by a computing device, cause the computing device to perform operations comprising:
   obtaining, by way of a user interface and for an iteration of a probabilistic computation of a wager game that comprises (i) a base feature associated with a first output calculation and (i) a progressive feature associated with a second output calculation, a first input signal representing a wager amount for the probabilistic computation and a second input signal representing a proportion of the first input signal to be allocated to the second output calculation of the progressive feature, wherein the probabilistic computation is associated with initial parameters for executing the base feature and the progressive feature;
   in response to obtaining the first input signal and the second input signal and based thereon, determining updated parameters of the probabilistic computation by:
      generating, by way of a first model associated with the progressive feature, a first output signal that is statistically proportional to the combination of the first input signal and the second input signal, wherein the first output signal represents a likelihood of a particular result being generated by the second output calculation, and wherein the particular result is configured to trigger the progressive feature, and
      generating a second output signal that adheres to constraints defined by a second model based on the second input signal, wherein the second model is associated with the base feature, and wherein the second output signal represents an expected value percentage of the first output calculation such that a constant overall expected value percentage for the probabilistic computation is retained independently of the first input signal and the second input signal,
   modifying the probabilistic computation by replacing the initial parameters with the updated parameters and within a predetermined period of time that simulates real-time operation of an apparatus configured to provide the wager game, wherein modifying the probabilistic computation comprises changing, for the iteration of the probabilistic computation, the likelihood of the particular result being generated by the second output calculation based on the first output signal and changing, for the iteration of the probabilistic computation, the expected value percentage of the first output calculation based on the second output signal;
   executing, by simulation of the apparatus configured to provide the wager game, the iteration of the probabilistic computation of the wager game by performing, using the probabilistic computation as modified, the first output calculation as part of the base feature of the wager game and the second output calculation as part of the progressive feature of the wager game; and causing the user interface to display a visual representation of the simulation of the apparatus, wherein the visual representation comprises an animation of a matrix representing results of performing the first output calculation as part of the base feature of the wager game and the second output calculation as part of the progressive feature of the wager game.

16. The article of manufacture of claim 15, wherein the operations further comprise:

maintaining a running sum of products of the first input signal and the second input signal across multiple iterations, wherein the first model defines a first relationship between the combination of the first input signal and the second input signal, the running sum, and the first output signal such that the first output signal is statistically and inversely proportional to the running sum.

17. The article of manufacture of claim 16, wherein the operations further comprise:

determining that the second output calculation generated the particular result; and based on determining that the second output calculation generated the particular result, resetting the running sum to zero.

18. The article of manufacture of claim 15, wherein the second model defines a second relationship between the expected value percentage of the first output calculation, an expected value percentage of the second output calculation weighted based on the second input signal, and the constant overall expected value percentage for the probabilistic computation.

19. A computing device comprising:

one or more processor;

a memory component; and program instructions, stored in the memory component, that upon execution by the one or more processor, cause the computing device to perform operations comprising:

obtaining, by way of a user interface and for an iteration of a probabilistic computation of a wager game that comprises (i) a base feature associated with a first output calculation and (ii) a progressive feature associated with a second output calculation, a first input signal representing a wager amount for the probabilistic computation and a second input signal representing a proportion of the first input signal to be allocated to the second output calculation of the progressive feature, wherein the probabilistic computation is associated with initial parameters for executing the base feature and the progressive feature;

in response to obtaining the first input signal and the second input signal and based thereon, determining updated parameters of the probabilistic computation by:

generating, by way of a first model associated with the progressive feature, a first output signal that is statistically proportional to the combination of the first input signal and the second input signal, wherein the first output signal represents a likelihood of a particular result being generated by the second output calculation, and wherein the particular result is configured to trigger the progressive feature, and generating a second output signal that adheres to constraints defined by a second model based on the second input signal, wherein the second model is associated with the base feature, and wherein the second output signal represents an expected value percentage of the first output calculation such that a constant overall expected value percentage for the probabilistic computation is retained independently of the first input signal and the second input signal, modifying the probabilistic computation by replacing the initial parameters with the updated parameters and within a predetermined period of time that simulates real-time operation of an apparatus configured to provide the wager game, wherein modifying the probabilistic computation comprises changing, for the iteration of the probabilistic computation, the likelihood of the particular result being generated by the second output calculation based on the first output signal and changing, for the iteration of the probabilistic computation, the expected value percentage of the first output calculation based on the second output signal;

executing, by simulation of the apparatus configured to provide the wager game, the iteration of the probabilistic computation of the wager game by performing, using the probabilistic computation as modified, the first output calculation as part of the base feature of the wager game and the second output calculation as part of the progressive feature of the wager game; and causing the user interface to display a visual representation of the simulation of the apparatus, wherein the visual representation comprises an animation of a matrix representing results of performing the first output calculation as part of the base feature of the wager game and the second output calculation as part of the progressive feature of the wager game.

20. The computing device of claim 19, wherein the operations further comprise:

maintaining a running sum of products of the first input signal and the second input signal across multiple iterations, wherein the first model defines a first relationship between the combination of the first input signal and the second input signal, the running sum, and the first output signal such that the first output signal is statistically and inversely proportional to the running sum.

* * * * *